United States Patent
Le Neel

(10) Patent No.: US 8,885,390 B2
(45) Date of Patent: *Nov. 11, 2014

(54) RESISTOR THIN FILM MTP MEMORY

(71) Applicant: STMicroelectronics Pte Ltd., Singapore (SG)

(72) Inventor: Olivier Le Neel, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/150,676

(22) Filed: Jan. 8, 2014

(65) Prior Publication Data

US 2014/0133215 A1      May 15, 2014

Related U.S. Application Data

(60) Continuation of application No. 13/953,626, filed on Jul. 29, 2013, now Pat. No. 8,644,053, which is a division of application No. 13/296,628, filed on Nov. 15, 2011, now Pat. No. 8,526,214.

(51) Int. Cl.
| | |
|---|---|
| *G11C 11/00* | (2006.01) |
| *G11C 11/56* | (2006.01) |
| *G11C 13/00* | (2006.01) |
| *G11C 11/21* | (2006.01) |

(52) U.S. Cl.
CPC ............ *G11C 13/0002* (2013.01); *G11C 11/56* (2013.01); *G11C 13/0069* (2013.01); *G11C 11/21* (2013.01)
USPC ........... 365/148; 365/51; 365/63; 365/189.08

(58) Field of Classification Search
USPC .................................. 365/148, 51, 63, 189.08
See application file for complete search history.

(56) References Cited

U.S. PATENT DOCUMENTS

| | | |
|---|---|---|
| 3,289,046 A | 11/1966 | Carr |
| 3,416,959 A | 12/1968 | Cormia |
| 4,104,607 A | 8/1978 | Jones |
| 4,125,854 A | 11/1978 | McKenny et al. |
| 4,392,992 A | 7/1983 | Paulson et al. |

(Continued)

FOREIGN PATENT DOCUMENTS

| | | |
|---|---|---|
| EP | 1 191 551 A2 | 3/2002 |
| FR | 2 880 177 A1 | 6/2006 |

(Continued)

OTHER PUBLICATIONS

Colgan et al., "Phase formation in Cr—Si thin-film interactions," *Appl. Phys. Lett.* 37(10):938-940, Nov. 15, 1980.

(Continued)

*Primary Examiner* — Viet Q Nguyen
(74) *Attorney, Agent, or Firm* — Seed IP Law Group PLLC

(57) ABSTRACT

An integrated circuit is formed having an array of memory cells located in the dielectric stack above a semiconductor substrate. Each memory cell has two adjustable resistors and two heating elements. A dielectric material separates the heating elements from the adjustable resistors. One heating element alters the resistance of one of the resistors by applying heat thereto to write data to the memory cell. The other heating element alters the resistance of the other resistor by applying heat thereto to erase data from the memory cell.

6 Claims, 31 Drawing Sheets

(56) References Cited

U.S. PATENT DOCUMENTS

| | | |
|---|---|---|
| 4,497,998 A | 2/1985 | West |
| 4,746,896 A | 5/1988 | Mcquaid et al. |
| 4,752,814 A | 6/1988 | Tuan |
| 4,766,411 A | 8/1988 | Prieto et al. |
| 4,876,668 A | 10/1989 | Thakoor et al. |
| 5,037,766 A | 8/1991 | Wang |
| 5,041,800 A | 8/1991 | Long et al. |
| 5,135,888 A | 8/1992 | Chan et al. |
| 5,152,869 A | 10/1992 | Ferraris et al. |
| 5,268,651 A | 12/1993 | Kerth |
| 5,468,672 A | 11/1995 | Rosvold |
| 5,485,138 A | 1/1996 | Morris |
| 5,494,845 A | 2/1996 | Sereda et al. |
| 5,503,878 A | 4/1996 | Suzuki et al. |
| 5,623,097 A | 4/1997 | Horiguchi et al. |
| 5,635,893 A | 6/1997 | Spraggins et al. |
| 5,640,023 A | 6/1997 | Balasinski et al. |
| 5,656,524 A | 8/1997 | Eklund et al. |
| 5,821,960 A | 10/1998 | Mitani |
| 5,844,208 A | 12/1998 | Tustaniwskyj et al. |
| 6,211,032 B1 | 4/2001 | Redford et al. |
| 6,274,452 B1 | 8/2001 | Miura et al. |
| 6,281,090 B1 | 8/2001 | Kukanskis et al. |
| 6,324,093 B1 | 11/2001 | Perner et al. |
| 6,358,809 B1 | 3/2002 | Nobinger et al. |
| 6,426,268 B1 | 7/2002 | Huppert et al. |
| 6,466,124 B1 | 10/2002 | Shibuya et al. |
| 6,504,226 B1 | 1/2003 | Bryant |
| 6,809,379 B2 | 10/2004 | Kreupl |
| 6,873,543 B2 | 3/2005 | Smith et al. |
| 6,890,810 B2 | 5/2005 | Amadon et al. |
| 6,891,747 B2 | 5/2005 | Bez et al. |
| 7,009,208 B2 | 3/2006 | Aratani et al. |
| 7,213,327 B2 | 5/2007 | Su et al. |
| 7,259,040 B2 | 8/2007 | Pellizer et al. |
| 7,338,637 B2 | 3/2008 | Pease et al. |
| 7,381,981 B2 | 6/2008 | Aitken et al. |
| 7,410,246 B2 | 8/2008 | Bell et al. |
| 7,410,879 B1 | 8/2008 | Hill et al. |
| 7,411,818 B1 | 8/2008 | Elmegreen et al. |
| 7,416,951 B2 | 8/2008 | Beach et al. |
| 7,425,724 B2 | 9/2008 | Aratani et al. |
| 7,427,926 B2 | 9/2008 | Sinclair et al. |
| 7,433,222 B2 * | 10/2008 | Hosoi et al. ............ 365/148 |
| 7,553,002 B2 | 6/2009 | Baek |
| 7,605,079 B2 | 10/2009 | Lai et al. |
| 7,633,079 B2 | 12/2009 | Chen et al. |
| 7,635,998 B1 | 12/2009 | Taki |
| 7,652,279 B2 | 1/2010 | Krusin-Elbaum et al. |
| 7,724,562 B2 | 5/2010 | Meyer et al. |
| 7,724,564 B2 | 5/2010 | Taylor et al. |
| 7,787,282 B2 | 8/2010 | Ramani et al. |
| 7,820,996 B2 | 10/2010 | Lee et al. |
| 7,838,875 B1 | 11/2010 | Tsang |
| 7,863,598 B2 | 1/2011 | Sugita et al. |
| 7,883,930 B2 | 2/2011 | Tsukamoto et al. |
| 7,948,790 B2 * | 5/2011 | Tsukamoto et al. ........... 365/148 |
| 7,969,806 B2 | 6/2011 | De Ambroggi et al. |
| 7,978,540 B2 | 7/2011 | Bardouillet et al. |
| 8,000,127 B2 | 8/2011 | Hamilton et al. |
| 8,093,535 B2 | 1/2012 | Heismann et al. |
| 8,125,818 B2 * | 2/2012 | Muraoka et al. ............ 365/148 |
| 8,129,706 B2 | 3/2012 | Ho et al. |
| 8,169,811 B2 * | 5/2012 | Li et al. ........................ 365/148 |
| 8,169,819 B2 | 5/2012 | Shima et al. |
| 8,174,877 B2 | 5/2012 | Baks |
| 8,208,294 B2 | 6/2012 | Happ et al. |
| 8,212,184 B2 | 7/2012 | Mowry et al. |
| 8,242,497 B2 | 8/2012 | Tsang |
| 8,242,876 B2 | 8/2012 | Le Neel et al. |
| 8,295,074 B2 * | 10/2012 | Yasuda et al. .................. 365/148 |
| 8,331,137 B2 * | 12/2012 | Takashima et al. ............ 365/163 |
| 8,334,525 B2 | 12/2012 | Nakai et al. |
| 8,400,257 B2 | 3/2013 | Lim et al. |
| 8,400,830 B2 * | 3/2013 | Ishikawa et al. ......... 365/185.11 |
| 8,436,426 B2 | 5/2013 | Le Neel et al. |
| 8,451,648 B2 * | 5/2013 | Kamoshida et al. .......... 365/148 |
| 8,488,359 B2 | 7/2013 | Chung |
| 8,493,171 B2 | 7/2013 | Le Neel et al. |
| 8,526,214 B2 | 9/2013 | Le Neel |
| 8,576,608 B2 * | 11/2013 | Tsushima et al. ............. 365/148 |
| 8,675,393 B2 * | 3/2014 | Katayama et al. ............ 365/148 |
| 2003/0150101 A1 | 8/2003 | Park et al. |
| 2003/0155591 A1 | 8/2003 | Kreupl |
| 2004/0021740 A1 | 2/2004 | Bell et al. |
| 2005/0052498 A1 | 3/2005 | Delametter et al. |
| 2006/0027892 A1 | 2/2006 | Yamashita et al. |
| 2006/0054953 A1 | 3/2006 | Son et al. |
| 2006/0203430 A1 | 9/2006 | Pinnow et al. |
| 2006/0224753 A1 | 10/2006 | Hama et al. |
| 2007/0170546 A1 | 7/2007 | Beach |
| 2007/0189053 A1 | 8/2007 | Pellizzer et al. |
| 2008/0048242 A1 | 2/2008 | Choi et al. |
| 2008/0217740 A1 | 9/2008 | Shiramizu et al. |
| 2010/0073122 A1 | 3/2010 | Le Neel et al. |
| 2012/0049323 A1 | 3/2012 | Ng et al. |
| 2012/0049324 A1 | 3/2012 | Le Neel et al. |
| 2012/0049997 A1 | 3/2012 | Lim et al. |
| 2012/0085748 A1 | 4/2012 | Le Neel et al. |
| 2012/0168754 A1 | 7/2012 | Le Neel et al. |
| 2012/0170352 A1 | 7/2012 | Le Neel et al. |
| 2012/0266452 A1 | 10/2012 | Le Neel et al. |
| 2013/0121057 A1 | 5/2013 | Le Neel |
| 2013/0314972 A1 | 11/2013 | Le Neel |
| 2013/0343115 A1 * | 12/2013 | Chien et al. ................... 365/148 |

FOREIGN PATENT DOCUMENTS

| | | |
|---|---|---|
| JP | 61100953 A | 5/1986 |
| WO | 2005/093868 A1 | 10/2005 |
| WO | 2009/001262 A1 | 12/2008 |

OTHER PUBLICATIONS

Extended European Search Report, dated Apr. 20, 2012, for European Application No. 11195500.1, 10 pages.

Extended European Search Report, dated Jul. 27, 2012, for European Application No. 11178590.3, 9 pages.

Galatsis et al., "p- and n-type Fe-doped $SnO_2$ gas sensors fabricated by the mechanochemical processing technique," *Sensors and Actuators B* 93:562-565, 2003.

Hieber et al., "Structural and Electrical Properties of CrSi2 Thin Film Resistors," *Thin Solid Films* 36(2):357-360, Aug. 1976.

Hwang et al., "A novel structured plysilicon thin-film transistor that increases the on-off current ratio," *Semicond. Sci. Technol.* 18:845-849, 2003.

Le Neel et al., "Multi-Layer Via-Less Thin Film Resistor," U.S. Appl. No. 12/862,594, filed Aug. 24, 2010, 48 pages.

Le Neel et al., "Multi-Layer Via-Less Thin Film Resister," Office Action mailed Jan. 30, 2012, for U.S. Appl. No. 12/862,594, 12 pages.).

Le Neel et al., "Thermo Programmable Resistor Based ROM," U.S. Appl. No. 12/981,379, filed Dec. 29, 2010, 48 pages.

Le Neel et al., "Thin Film Metal-Dielectric-Metal Transistor," U.S. Appl. No. 12/981,375, filed Dec. 29, 2010, 48 pages.

Le Neel, "Resistor Thin Film MTP Memory," U.S. Appl. No. 13/953,626, filed Jul. 29, 2013, 88 pages.

Lim et al., "Via-Less Thin Film Resistor With a Dielectric Cap," U.S. Appl. No. 12/862,599, filed Aug. 24, 2010, 46 pages.

Ng et al., "Lateral Connection for a Via-Less Thin Film Resistor," U.S. Appl. No. 12/862,589, filed Aug. 24, 2010, 50 pages.

Nishida et al., "A New Self-Aligned A-SI TFT Using Ion Doping and Chromium Silicide Formation," *Materials Research Society Proceedings* 219:303-308, Apr. 1991.

Nishida et al., "Semiconducting Properties of Pure and Mn-Doped Chromium Disilicides," *Journal of Physics and Chemistry of Solids* 39(5):499-505, Jan. 1978.

(56) References Cited

OTHER PUBLICATIONS

Privitera et al., "Morphological and electrical characterization of $Si_xCr_yC_zB_v$ thin films," *Microelectronic Engineering* 87:430-433, 2010.
Sukhawuttichai et al., "Effect of $Bi_2O_3$ Addition on the Microstructure and Properties of the $SnO_2$ Varistor System," *33rd Congress on Science and Technology of Thailand*, Walailak University, Nakhon Si Thammarat, Thailand, Oct. 18-20, 2007, pp. 1-4.
Tuite, "Resistor Trimming," Electronic Design, ED Online #17261, URL=http://electronicdesign.com/article/power/resistor-trimming17261.aspx, dated Oct. 25, 2007, 2 pages.
Yamauchi et al., "Polysilicon Thin-Film Transistors with Channel Length and Width Comparable to or Smaller than the Grain Size of the Thin Film," *IEEE Transactions on Electron Devices* 38(1):55-60, Jan. 1991.

\* cited by examiner

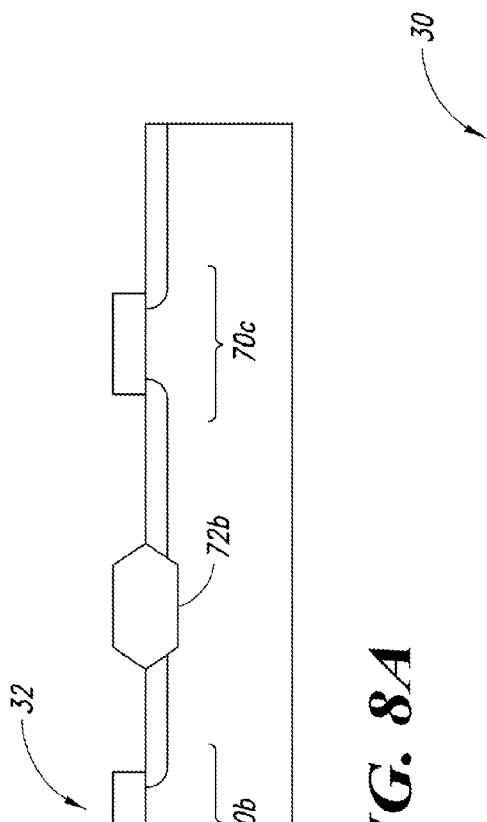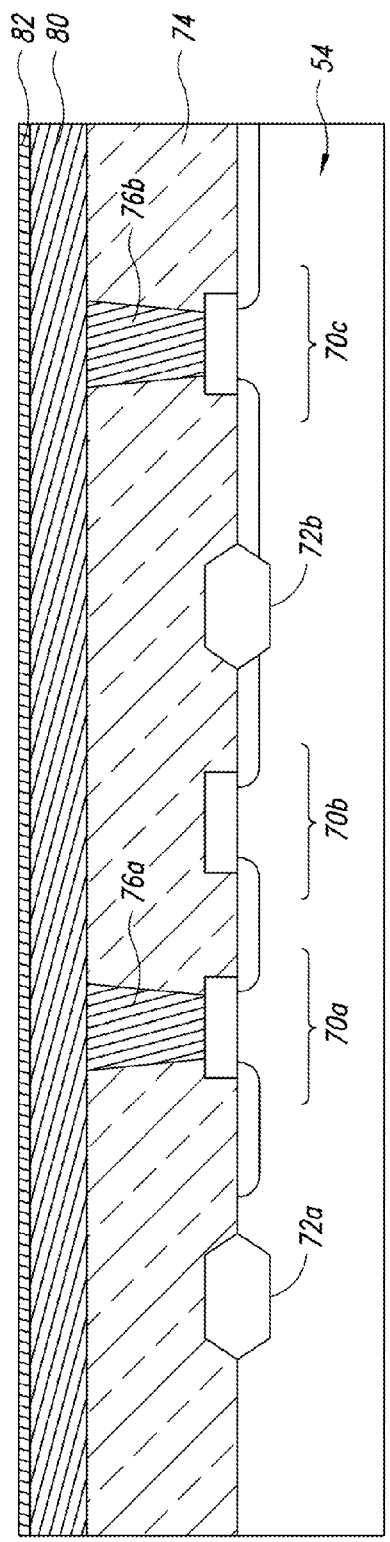

RESISTOR THIN FILM MTP MEMORY

BACKGROUND

1. Technical Field

The present disclosure relates to the field of integrated circuits. The present disclosure relates more particularly to memories in integrated circuits.

2. Description of the Related Art

Integrated circuits are used in a large variety of applications. Individual integrated circuits can take the form of voltage amplifiers, voltage regulators, digital signal processors, microcontrollers, wireless adapters, microprocessors, smart cards, and many other devices. Some integrated circuits have circuitry that performs many of these functions on a single chip.

Many integrated circuits are provided with memory cells that store executable instructions for the proper functioning of the integrated circuit. For example, microcontrollers often include an array of memory cells that store data for the operation of the microcontroller. Often this memory is one-time programmable and is pre-programmed for specific applications by the manufacturer. In some instances the array of memory cells is programmable by the user.

Common types of memory used in microcontrollers and other integrated circuits are EPROM, EEPROM, and Flash. An EPROM memory cell includes a transistor with a floating gate. The floating gate can be programmed by storing charge thereon and is erasable by irradiating the transistor with ultraviolet (UV) light. Like EPROM, a traditional EEPROM memory cell includes a transistor with a floating gate. But unlike EPROM, an EEPROM memory cell can be erased electrically without irradiation by UV light. A flash memory cell also includes a transistor with a floating gate and differs from traditional EEPROM in that cells are not singly erasable and must be erased in large blocks.

The above-described types of memory cells suffer from the drawback that they all include transistors formed on the semiconductor substrate. As integrated circuits become more and more complex, more area of the semiconductor substrate is used to form control circuitry. A large array of memory cells that each includes one or more transistors thus takes up precious area of the semiconductor substrate that could be used to increase the complexity of control circuitry or to produce more integrated circuits on a single wafer.

BRIEF SUMMARY

One embodiment is an integrated circuit having an array of memory cells above a surface semiconductor substrate. Because the array of memory cells is not formed at the surface of the semiconductor substrate more surface area of the substrate can be used for increasing complexity of control circuitry formed of transistors at the surface of the substrate. In one embodiment, all elements of the memory storage cell are positioned on an insulating layer, without a use of a semiconductor layer in the storage cell.

One embodiment is an integrated circuit comprising a semiconductor substrate and a first dielectric layer overlying the substrate. An adjustable resistor overlies the dielectric layer. The resistance of the adjustable resistor is representative of a value of data stored in the adjustable resistor. A heating element is adjacent the adjustable resistor. The heating element is separated from the adjustable resistor by a second dielectric layer and is configured to write data to the adjustable resistor by heating the adjustable resistor to alter its structure and thus its resistivity.

In one embodiment the adjustable resistor is a multilayer resistor composed of a first thin film layer and a second thin film layer in contact with the first thin film layer. In one embodiment the first thin film layer is chromium silicon having a first concentration of silicon and the second thin film layer is chromium silicon having a second concentration of silicon different than the first concentration. The first thin film layer mixes with the second thin film layer to alter the resistance of the adjustable resistor when heat is applied to the adjustable resistor.

One embodiment is an integrated circuit comprising a semiconductor substrate, control circuitry in the semiconductor substrate, and a first dielectric layer above the semiconductor substrate. A first array of memory cells is above the dielectric layer. Each memory cell of the first array includes a respective adjustable resistor and an adjacent heating element separated from the adjustable resistor by a second dielectric layer. The heating element is configured to write data to the adjustable resistor by heat transfer. In one embodiment each memory cell of the first array of memory cells is a multi-bit memory cell. A first metal interconnection layer is on the dielectric layer. A second metal interconnection layer is above the first metal interconnection layer. The first array of memory cells is located at a level corresponding to a level of the second metal interconnection layer.

In one embodiment a second array of memory cells is formed above the first array of memory cells. The second array of memory cells may be formed at a level corresponding to a third level of metal interconnections. A third array of memory cells may be formed above the second array. In one embodiment there is an array of memory cells formed at each metal interconnection level of the integrated circuit.

One embodiment is a method having the steps of: forming control circuitry in a semiconductor substrate, forming a dielectric layer above the semiconductor substrate, and forming a thin film adjustable resistor above the dielectric layer. The method further includes storing data in the adjustable resistor by heating the adjustable resistor to alter the resistivity of the adjustable resistor.

In one embodiment forming the adjustable resistor comprises forming a first layer of resistive material and forming a second layer of resistive material directly in contact with the first layer, the first and second layers forming the adjustable resistor.

There are at least two different ways to heat the adjustable resistor. In one embodiment, a heater is placed next to the adjustable resistor. In a second embodiment current is passed through the resistor itself, causing the resistor to heat up. The heating of the adjustable resistor is thus carried out by the resistor itself. In the first embodiment, current passes through a first thin film heater element to heat it to a selected temperature for altering a structure of a second thin film resistor by heat transfer from the first thin film resistor. This stores storing data in the thin film resistor by altering its structure. The method further comprises reading data from the second thin film resistor by obtaining an indication of a resistance of the second thin film resistor.

In one embodiment a plurality of wordlines is formed of the second set of metal interconnection lines, each wordline connecting to a row of memory cells of the array of memory cells. A plurality of bitlines each connects to a column of memory cells of the array of memory cells. A plurality of heater lines each connects to either a row or a column of memory cells of the array of memory cells.

In one embodiment, the storage resistor is a first thin film resistive layer and a source layer in contact with the first thin film resistive layer. The source layer is a source of atom migration to the first thin film resistive layer to change a resistance of the first thin film resistive layer. A heat transfer dielectric layer is adjacent the first thin film resistive layer. A thin film heating layer of refractory metal is adjacent the first heat transfer dielectric layer. The thin film heating layer is configured to generate heat to pass through the heat transfer dielectric layer to the first thin film resistive layer and the source layer to write data to the first thin film resistive layer by causing a migration of atoms from the source layer to the first thin film resistive layer.

In one embodiment the first thin film resistive layer is a first chromium silicon alloy having a first concentration of silicon. The source layer is a second chromium silicon layer having a second concentration of silicon. The second thin film resistive layer is a tantalum aluminum alloy. The first thin film resistive layer is silicon and the source layer is an oxide. The heat transfer layer is silicon nitride.

The present application has some aspects of the disclosure which overlap and are similar to application entitled "Thin Film Metal-Dielectric-Metal Transistor" filed on Dec. 29, 2010, the same day as the parent application, and having common ownership therewith and bearing application Ser. No. 12/981,375, and which is now published on Jul. 5, 2012 as U.S. 2012/0168754.

BRIEF DESCRIPTION OF THE SEVERAL VIEWS OF THE DRAWINGS

FIGS. 8A-8E illustrate various steps in a process for forming an integrated circuit according to one embodiment.

DETAILED DESCRIPTION

Figure 1:
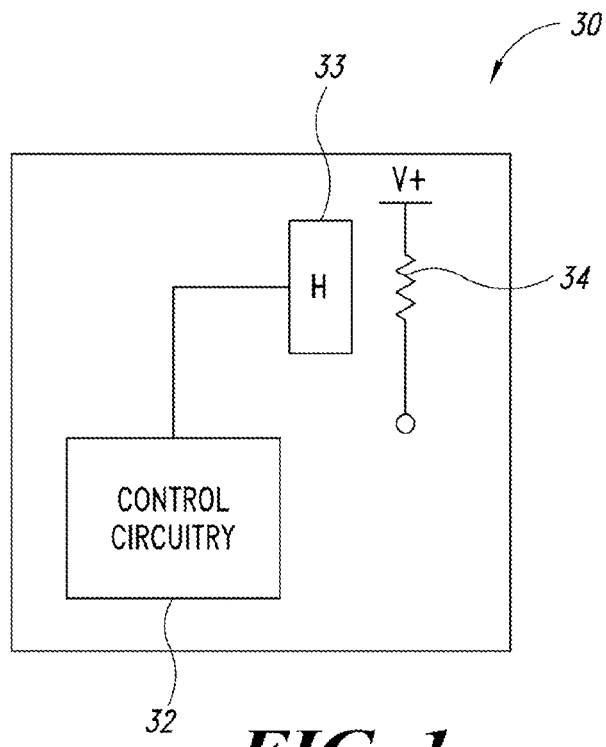
FIG. 1 is a block diagram of an integrated circuit according to one embodiment.

FIG. 1 is a block diagram of an integrated circuit 30 according to one embodiment of the invention. The integrated circuit 30 includes control circuitry 32, a heating element 33 connected to the control circuitry 32, and an adjustable resistor 34 adjacent the heating element 33. The adjustable resistor is close enough to the heating element 33 that the heating element 33 can raise the temperature of the adjustable resistor 34 to alter the resistance of the adjustable resistor 34.

The adjustable resistor 34 acts as a memory storage device. The control circuitry 32 can write data to the adjustable resistor 34 by activating the heating element 33 to generate heat sufficient to alter the resistivity of the structure of the adjustable resistor 34. When the resistivity of the structure of the adjustable resistor 34 is altered, the resistance of the adjustable resistor 34 is also altered.

The resistance of the adjustable resistor 34 represents the value of data stored in the adjustable resistor 34. The control circuitry 32 can subsequently read this data by measuring the resistance of the adjustable resistor 34 in any suitable manner. In one embodiment the control circuitry 32 reads the data stored in the adjustable resistor 34 by passing a current through the adjustable resistor 34 and comparing that current to a control current. The control current may be a current passed through an unaltered adjustable resistor 34.

The adjustable resistor 34 may be a one-time programmable read only memory cell. In this embodiment, after being programmed, the adjustable resistor 34 cannot be brought back to a previous state of resistance. Alternatively, the adjustable resistor 34 may be of a material that can be heated a plurality of times to change the value of the data stored therein from a first value to a second value.

The adjustable resistor 34 may also be a multi-bit memory cell. During a writing process, the heating element 33 can be controlled to apply a selected level of heat for a selected duration to the adjustable resistor 34 to adjust the resistance of the adjustable resistor 34 to one of multiple possible resistances. In this way the resistance of the adjustable resistor 34 can represent more than one bit of data. The number of bits the adjustable resistor 34 can hold is in part based on how precisely and reliably the resistance can be altered in small increments by the writing process.

Further details regarding memory arrays including adjustable thin film resistors can be found in U.S. patent application Ser. No. 12/981,379 which is incorporated by reference herein in its entirety. Further details regarding formation of thin film resistors and heating elements can be found in U.S. patent application Ser. No. 12/981,375 which is incorporated by reference herein in its entirety.

Figure 2:
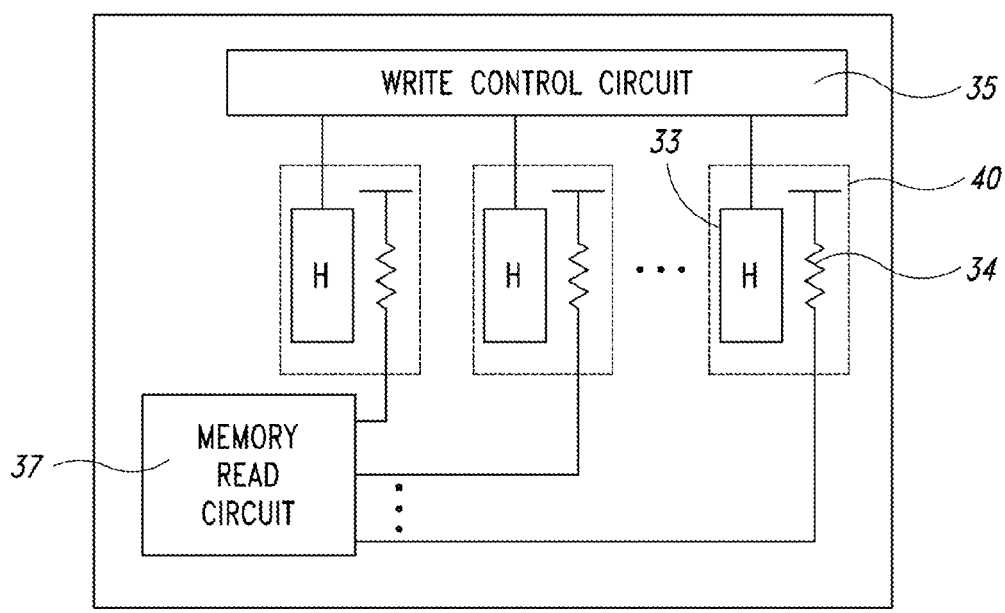
FIG. 2 is a block diagram of a memory array according to one embodiment.

FIG. 2 is a block diagram of an array 36 of memory cells 40. Each memory cell 40 comprises an adjustable resistor 34 and a heating element 33. Each heating element 33 is connected to a write control circuit 35. The write control circuit 35 allows a heating element 33 to perform a write process on an adjacent adjustable resistor 34 of the same memory cell 40. While FIG. 2 shows three memory cells 40, the memory array 36 typically will contain many more memory cells 40.

In one embodiment, the write control circuit 35 allows a selected heating element 33 to be connected to a positive voltage supply. When the heating element 33 is connected to the positive voltage supply a programming current flows in the heating element 33. The heating element 33 is connected to the positive voltage supply for a selected period of time during which a current flows through the heating element 33. The current in the heating element 33 causes the heating element 33 to generate heat and to heat the adjustable resistor 34 of the same memory cell 40. The increase in temperature causes a structural change of the adjustable resistor 34, which in turn causes a change in the resistance of the adjustable resistor 34. In this way each heating element 33 of the array 36 can write data to an adjacent adjustable resistor 34.

To write data to the adjustable resistor 34, the heating element 33 raises the temperature of the adjustable resistor 34 to a temperature beyond what the adjustable resistor 34 would experience during normal operation of the integrated circuit 30. Typically, an integrated circuit 30 will not reach temperatures higher than 150° C. during normal operating conditions after processing, packaging, and testing of the integrated circuit 30 has been completed. The adjustable resistor 34 is configured so that its resistance will not be altered when subjected to temperatures in the normal operating range. The adjustable resistor is configured to undergo a permanent change or a semi-permanent change in resistance when the temperature is raised much higher than the normal operating temperatures, for example in the range of 400° C.-500° C. for a duration of about 1 ms. When the adjustable resistor 34 cools to a normal operating temperature after the programming cycle, its resistance is a new value. This new value will be different than what it was at that normal operating temperature prior to the programming cycle. The new value will stay at this value for the life of the resistor, unless of course it is programmed again.

The adjustable resistor 34 is connected to a memory read circuit 37. The memory read circuit 37 allows the adjustable resistor 34 of a selected memory cell 40 to be read. When the adjustable resistor 34 of a memory cell 40 is read, an indication of the value of the resistance of the adjustable resistor 34 is obtained. The resistance of the adjustable resistor 34 represents a value of data stored in the adjustable resistor 34. The resistance of the adjustable resistor 34 can be measured directly or indirectly by measuring a voltage drop across the adjustable resistor 34, by measuring a current flowing in the resistor, by comparing a voltage drop or current to a control value, or by any suitable means for detecting the resistance of the adjustable resistor 34.

The memory array 36 of FIG. 2 shows only the heating elements 33 of the memory cells 40 being connected to the write control circuit 35, but many other configurations are possible. For example both the heating elements 33 and the adjustable resistors 34 of the memory cells 40 may be connected to the write control circuitry. Likewise, the heating elements 33 of the memory cells 40 may also be connected to the memory read circuit 37. In other embodiments, all or portions of the write control circuit 35 and the memory read circuits 37 may be located away from the memory array 36, for example in address and selection circuitry.

Figure 3:
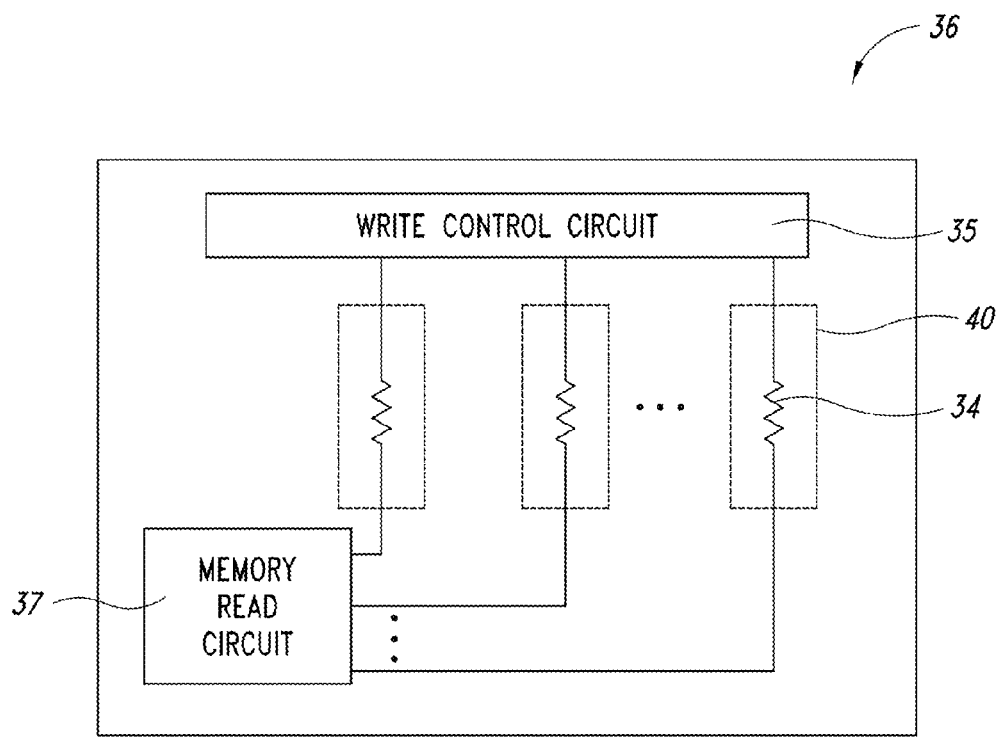
FIG. 3 is a block diagram of a memory array according to one embodiment.

FIG. 3 illustrates an array 36 of memory cells 40 according to one embodiment of the invention. In FIG. 3 each memory cell 40 of the array 36 has only an adjustable resistor 34. Each adjustable resistor 34 is connected to the write control circuit 35 and to the memory read circuit 37.

The write control circuitry 35 enables a write cycle by connecting a selected adjustable resistor 34 to a positive voltage supply which as a high current source. When the adjustable resistor 34 is connected to the positive voltage supply a current flows in the adjustable resistor 34. The current flowing through the resistor 34 causes the adjustable resistor 34 to generate heat and to raise the temperature of the adjustable resistor 34. When the temperature is raised sufficiently, the resistance of the adjustable resistor 34 is altered, thus writing data to the adjustable resistor 34. In this embodiment the heating element 33 is not present because the adjustable resistor 34 generates its own heat to alter its resistance when a current flows through it. The voltage and current applied to the resistor 34 are selected to heat the resistor to the correct value to program it but not to damage it.

The memory read circuit 37 allows a selected adjustable resistor 34 to be read. When the adjustable resistor 34 of a memory cell 40 is read, an indication of the resistance of the adjustable resistor 34 is obtained. The resistance of the adjustable resistor 34 represents a value of data stored in the adjustable resistor 34. The resistance of the adjustable resistor can be measured by any acceptable technique, for example, by measuring a voltage drop across the resistor, by measuring a current flowing in the resistor, by comparing a voltage drop or current to a control value, or by any suitable means for detecting the resistance of the adjustable resistor 34. In other embodiments, all or portions of the write control circuit 35 and the memory read circuit 37 may be located away from the memory array 36, for example in address and selection circuitry not shown.

Figure 4:
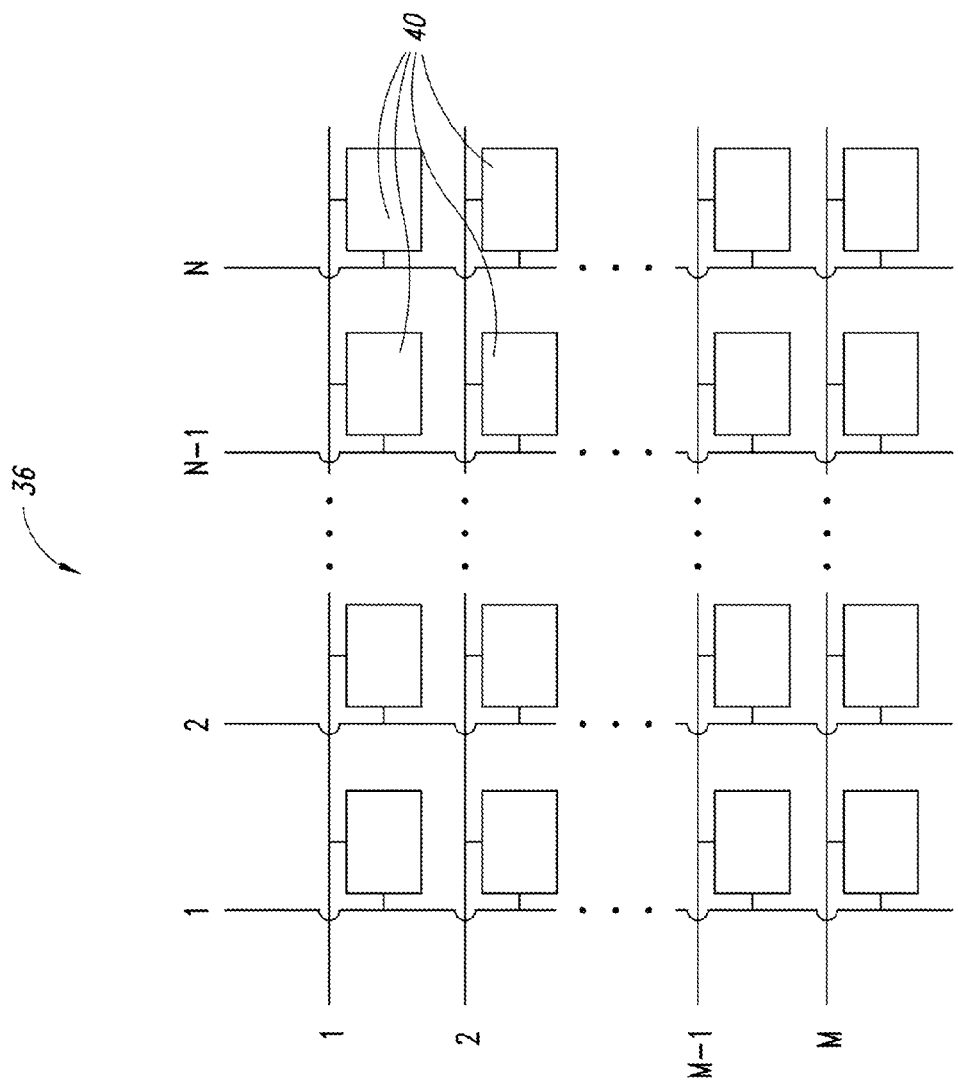
FIG. 4 is a block diagram of a memory array according to one embodiment.

FIG. 4 illustrates a memory array 36 according to one embodiment of the invention. The memory array 36 comprises a plurality of memory cells 40 arranged in rows and columns. Each memory cell 40 contains an adjustable resistor 34 of the types shown and described with respect to FIGS. 1-3, and may also contain a heating element 33 as shown in FIGS. 1 and 2.

Each column of memory cells 40 is connected to a separate bitline. Here there are n bitlines for n columns of memory cells. Each row of memory cells is connected to a separate wordline. M wordlines are illustrated for M rows of memory cells 40. Address and selection circuitry are utilized to select individual memory cells for read or write cycles. To select an individual memory cell 40 for a read or write cycle, the bitline and the wordline to which the memory cell 40 is connected will be selected and connected to the proper voltage supply lines for the read or write cycle. Multiple memory cells may be written to or read from simultaneously. For example, during a read cycle a single wordline may be selected while many or all bitlines are selected. Each selected bitline may be connected to separate read circuitry, allowing a multitude of memory cells 40 in a row of memory cells 40 to be read simultaneously. In the same manner a plurality of memory cells 40 may be written to at the same time by selecting one wordline and selecting multiple bitlines.

Figure 14:
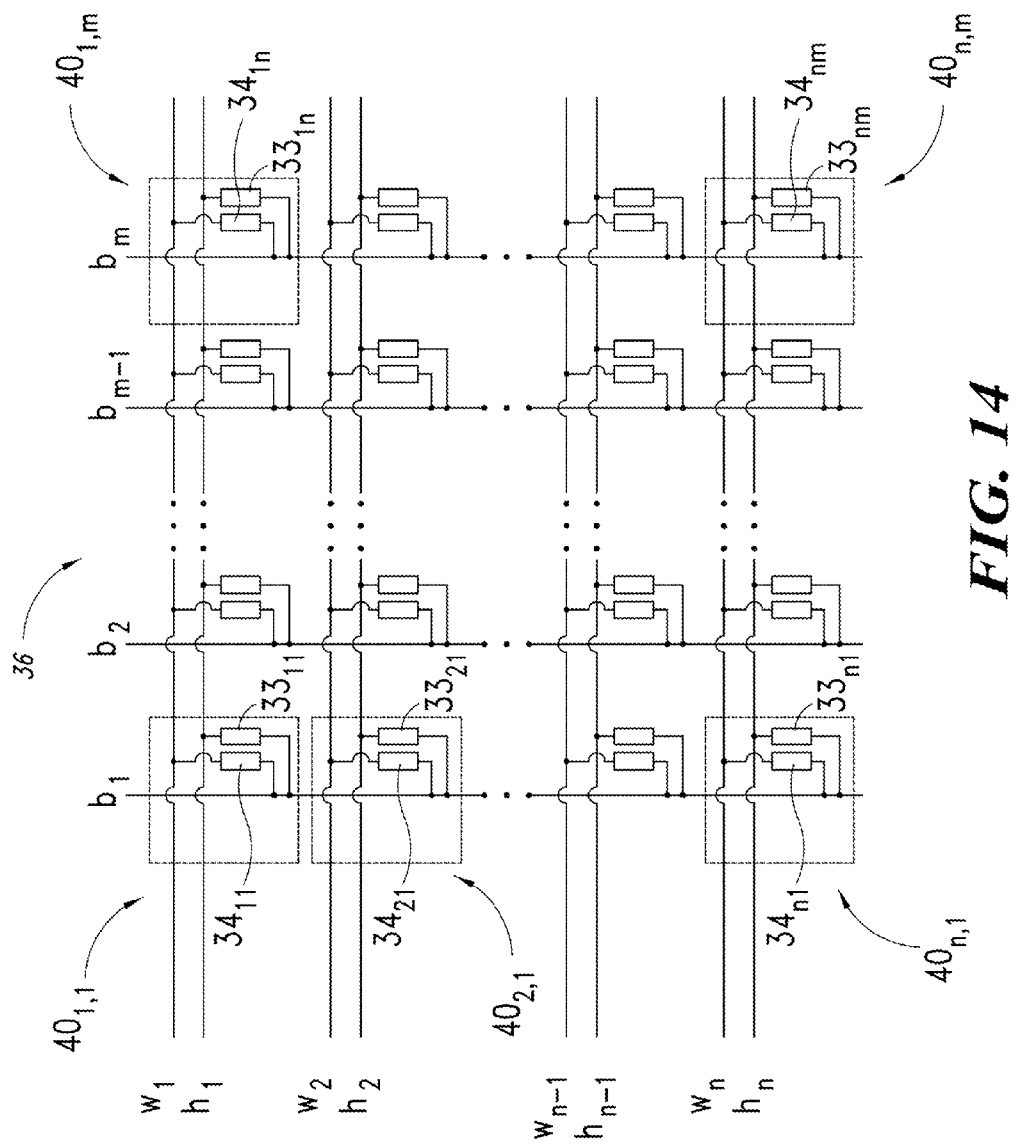
FIG. 14 is a circuit diagram of a memory array according to one embodiment.

In other embodiments, each row of memory cells 40 may also be connected to a separate heater line or column, one example of which is shown in FIG. 14. The heater lines may be utilized to separately send current through heating elements 33 of selected memory cells 40. Many configurations are possible to implement an array 36 of memory cells 40 including many commonly known techniques of address and selection circuitry.

Figure 5:
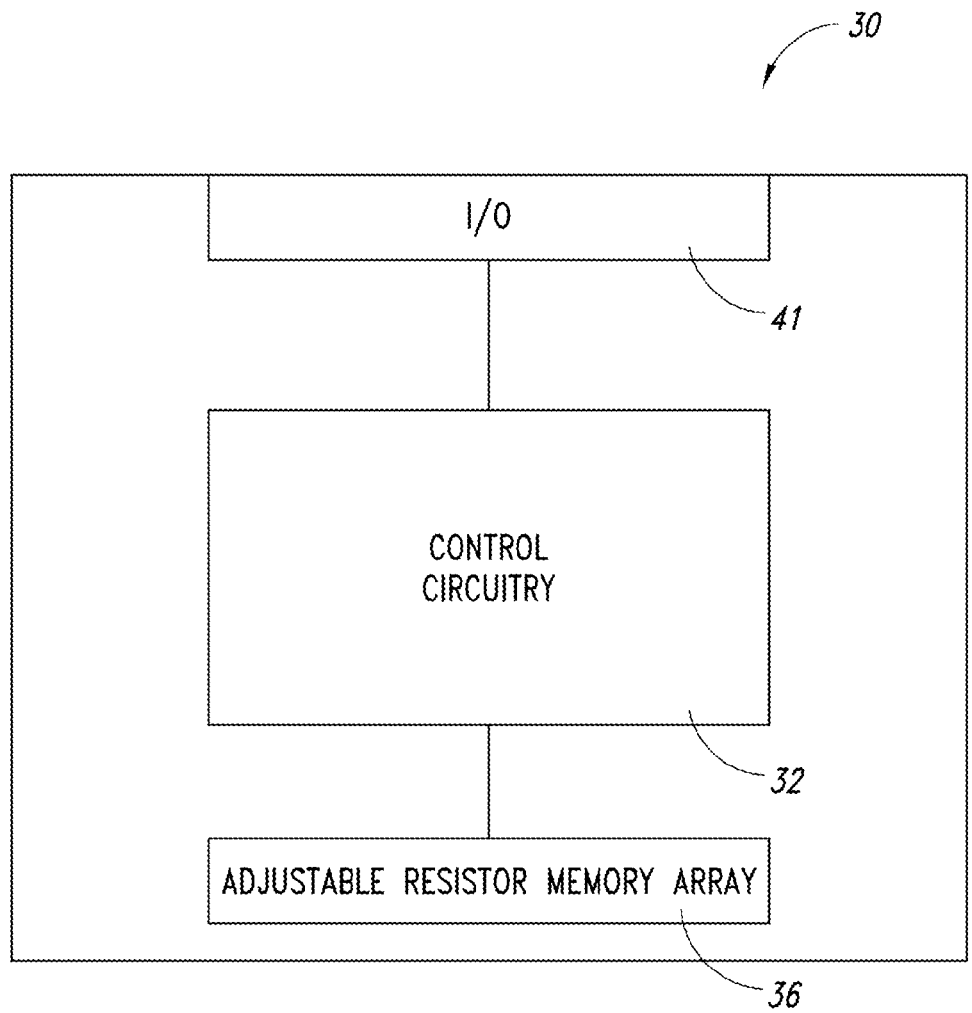
FIG. 5 is a block diagram of an integrated circuit according to one embodiment.

FIG. 5 is an integrated circuit 30 according to one embodiment of the invention. The integrated circuit 30 of FIG. 5 includes control circuitry 32 and an array 36 of memory cells coupled to the control circuitry 32. Each memory cell of the array includes an adjustable resistor 34 as described in relation to FIGS. 1-4. The integrated circuit 30 also includes input/output circuitry 41 coupled to the control circuitry 32. The input/output circuitry 41 allows the integrated circuit 30 to communicate with other devices or with an end user.

In one embodiment the integrated circuit 30 is a microcontroller. Microcontrollers are used in a large variety of applications. Microcontrollers are often used in applications in which the large processing power of a microprocessor is not needed, and in which low cost and small size are important. It may contain a CPU core, a clock, timing circuits, interrupts, I/O circuitry, and memory all integrated into one chip. In traditional microcontroller the memory is often an array of memory cells such as ROM, EPROM, EEPROM, or flash. The memory in a microcontroller is often one-time programmable. The microcontroller memory stores executable instructions that run the microcontroller and may contain data for operating devices that the microcontroller controls.

As microcontrollers are asked to do more complex processing, more transistors may need to be formed on the chip to create processing architecture. Additionally, each memory cell of traditional ROM, EPROM, EEPROM and FLASH might be formed of two or more transistors, for example, including a floating gate transistor and one or more access transistors. These memory transistors of the traditional memory arrays are formed at the surface of the chip and thus take up surface area on the chip that could be used for processing circuitry or other applications. This increases the cost of the microcontroller while decreasing the area available for processing functionality.

A memory cell 40 containing an adjustable resistor 34 according to FIGS. 1-4 of the present disclosure may be formed spaced apart from the surface of the microcontroller as will be described in more detail herein. This advantageously allows for more surface area of the substrate to be used for processing circuitry of the microcontroller. Thus the circuit complexity and memory capacity can increase without increasing the footprint of the semiconductor array.

In the embodiment of FIG. 5, microcontroller 30 has control circuitry 32 including processing circuitry, I/O circuitry 41, and an array 36 of adjustable resistor memory cells 40. The control circuitry 32 may be processing circuitry configured to execute instructions stored in the memory array 36. In one embodiment the memory array 36 is preprogrammed during manufacture or testing of the microcontroller 30. In other embodiments the memory array 36 is programmed prior to being installed in a system or device of which the microcontroller 30 will be part. The preprogramming can occur any time prior to being used by an end user. In one embodiment the memory array is only partially preprogrammed, with unprogrammed portions of the array programmable by an end user. In one embodiment the memory array is entirely programmable by an end user. An end user can write to or read from the memory array by means of the input/output circuitry. The microcontroller 30 may be programmed with data received from other circuits of a device in which the microcontroller 30 is installed. In one embodiment the memory cells 40 of the memory array 36 are one-time programmable. In other embodiments the memory cells 40 of the memory array 36 are reprogrammable, as explained later herein.

Figure 6:
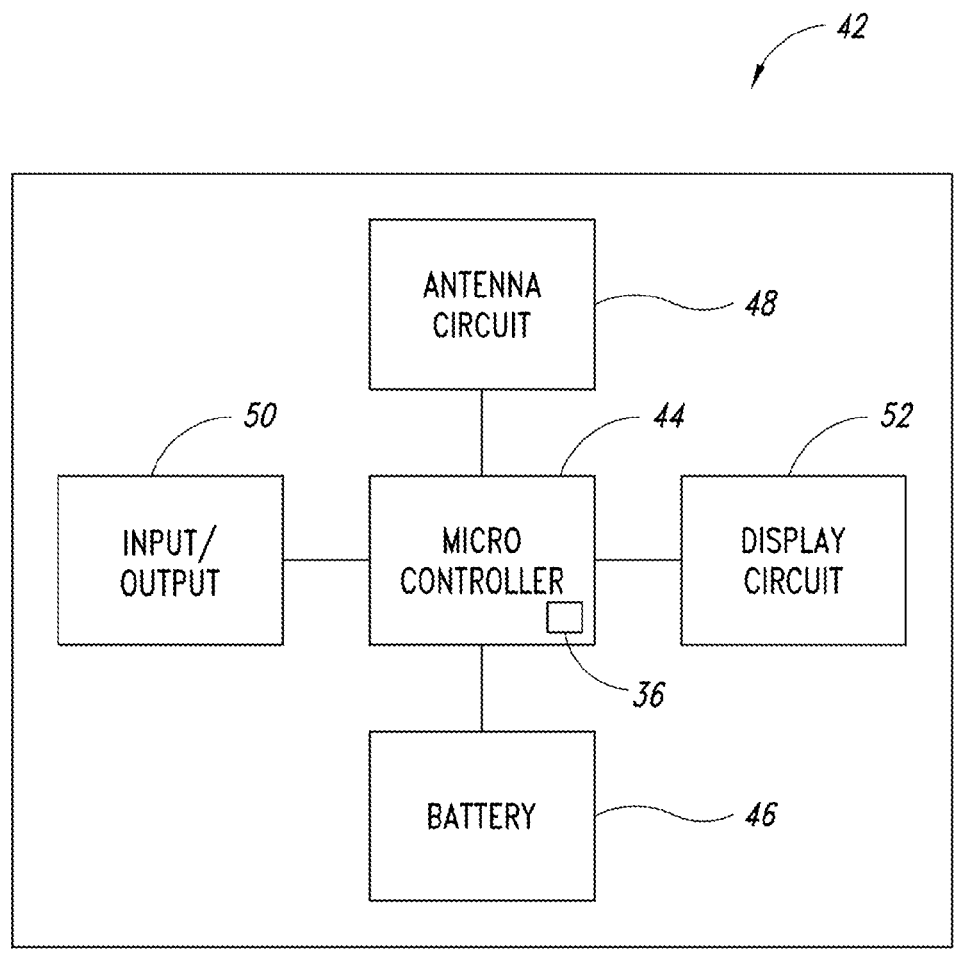
FIG. 6 is a block diagram of a portable electronic device according to one embodiment.

FIG. 6 is a portable electronic device 42 according to one embodiment of the invention. In one embodiment the portable electronic device 42 is a cell phone, a PDA, a laptop, a GPS, a gaming system or controller, an MP3 player, a medical device, or any other portable electronic device. The portable electronic device 42 has a microcontroller 30 according to one embodiment as described in relation to FIG. 5. Alternatively, the processor can be a microprocessor or a microcomputer or other CPU based device. The portable electronic device 42 further comprises peripheral functional devices including a battery 46, an antenna circuit 48, an input/output circuit 50 of the portable electronic device, and a display circuit 52, all of which may be controlled by the microcontroller 30. The portable electronic device 42 may in practice contain many other components not shown here for the sake of simplicity.

The microcontroller 30 controls all or a portion of the function of the antenna circuit 48, the input/output circuitry 50, the display circuit 52, and the battery 46. The microcontroller 30 has a memory array 36 of adjustable resistor memory cells 40 as described in relation to FIGS. 1-5. Instructions for the operation of the microcontroller 30 are stored in the memory array 36. The memory array 36 may also contain data for controlling the operation of the display circuit 52, input/output circuitry 50, the antenna circuit 48, or the battery 46. Additionally, the other circuits of the portable electronic device may contain their own memory arrays 36 according to FIGS. 1-5.

FIG. 6 illustrates only one embodiment in which a microcontroller 30 according to the present disclosure may be used (in a portable electronic device). Microcontrollers are used in a very large variety of devices, like cars, toys, household appliances, alarm clocks, and many other kinds of devices. All of these may benefit from a microcontroller 30 with increased memory capacity and processing power at a more affordable cost.

Figure 7:
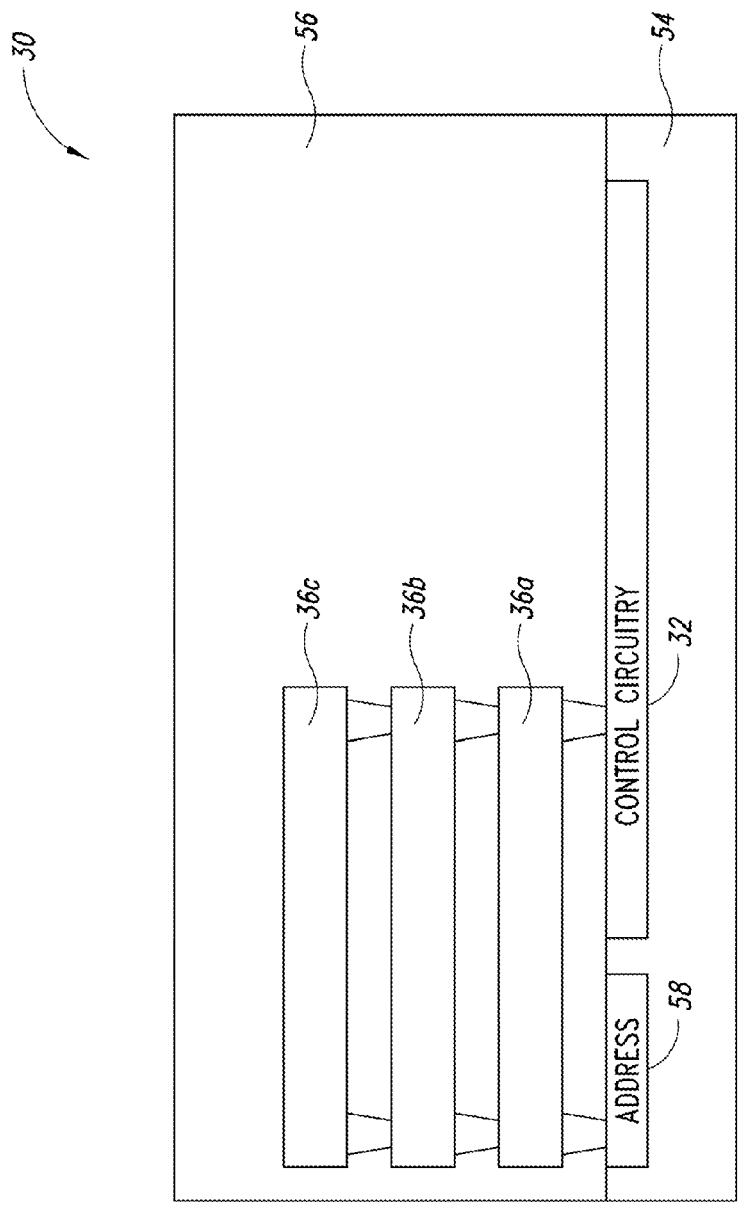
FIG. 7 is a block diagram of an integrated circuit according to one embodiment.

FIG. 7 illustrates an integrated circuit 30 according to one embodiment of the invention. The integrated circuit 30 includes a semiconductor substrate 54 and a dielectric stack 56 formed above the semiconductor substrate 54. The dielectric stack 56 is shown as a single dielectric layer in FIG. 7, but in practice the dielectric stack 56 is formed of many dielectric layers. Multiple levels of metal interconnections are also formed between layers of the dielectric stack 56. Control circuitry 32 is formed in the semiconductor substrate 54. In one embodiment the control circuitry 32 includes a plurality of transistors formed according to known methods. Address circuitry is also formed in the semiconductor substrate 54.

FIG. 7 illustrates a particularly advantageous feature of one embodiment. A first array 36a of memory cells 40 as described in FIGS. 1-5 is formed in the dielectric stack 56 above the substrate 54. Because the memory cells 40 do not include transistors formed at the surface of the semiconductor substrate, the memory array 36a does not take up valuable area of the semiconductor substrate 54. This means that more complex control circuitry 32 can be placed in each integrated circuit 30, or that each integrated circuit 30 can be smaller and thus more integrated circuits 30 can be fabricated from a single semiconductor wafer. Because an array 36a of memory cells 40 according to one embodiment does not need to be formed at the surface, additional arrays 36b, 36c of memory cells 40 can be formed above the first array 36a of memory cells 40.

As shown in FIG. 7, a second array 36b of memory cells 40 is formed in the dielectric stack 56 above the first array 36a of memory cells 40. A third array 36c of memory cells 40 is formed above the second array 36b of memory cells 40. This stacking of memory arrays allows the integrated circuit 30 to have more memory cells 40 than if the memory cells 40 had to be formed at the surface of the semiconductor substrate 54. Additional arrays 36 of memory cells 40 can be formed in the dielectric stack 56 above array 36c. As many arrays 36 as can be fit in the dielectric stack 56 can be formed. In this way the density of memory cells in an integrated circuit 30 can be multiplied by the number of arrays 36 in the dielectric stack 56. The number of memory cells 40 can be easily increased by stacking arrays three dimensionally.

During manufacture of the integrated circuit 30, many dielectric layers of the dielectric stack 56 are subsequently formed one on top of another. Between steps of forming dielectric layers of the dielectric stack 56, metal interconnect lines, contacts, plugs, and vias are formed between the layers of the dielectric stack 56. In an integrated circuit 30, there are typically several layers of interconnecting metal lines formed in the dielectric stack 56. Vias, contacts, and plugs are formed to connect the metal interconnect lines located higher in the dielectric stack 56 with metal interconnect lines located lower in the dielectric stack 56. The metal interconnect lines are said to be formed of metal one, metal two ... metal n, where metal one forms the interconnect lines closest to the substrate and metal n forms the interconnect lines furthest from the substrate. The metal interconnect lines of a same level are formed of a same metal layer deposited on a patterned layer of the dielectric stack 56. The metal layer is then patterned and etched to form the metal interconnect lines of that metal layer.

In one embodiment, an array 36 of memory cells 40 is formed at a same level as metal interconnect lines of one of the metal layers 1-n as described above. In the embodiment shown in FIG. 7, the first memory array 36a could be formed at metal one or between metal one and metal two. The second memory array 36b could be formed at the same level as metal two, or between metal two and metal three. In a preferred embodiment of the invention the first memory array 36a is formed at a metal level higher than metal one, for instance at a level between metal two and metal three. An array 36 formed at a level corresponding to metal one may take up extra area at the surface of the substrate in order to form connecting lines with address and control circuitry 58, 52. Thus it is preferable to form the first memory array 36a at a level higher than metal one. The memory arrays 36a-36c may also be formed between metal levels rather than at substantially the same level as the metal layers.

As mentioned above, address circuitry 58 is formed in the substrate 54 adjacent the control circuitry 32. The address circuitry 58 allows the control circuitry 32 to select individual memory cells 40 of the arrays 36a-36c of memory cells 40 for read or write operations. Address circuitry 58 is well known in the art and the methods for implementing it are not described here.

FIGS. 8A-8E illustrate an integrated circuit 30 according to one embodiment of the invention. The dimensions, materials, process steps, and layers described in 8A-8E can be altered in numerous ways without departing from the scope of this invention and are given only by way of example. Furthermore, the layers shown in FIGS. 8A-8E are not drawn to scale.

In FIG. 8A control circuitry 32 including several MOS transistors 70a-70c are formed at the surface of a silicon substrate 54. The MOS transistors 70a-70c include source, drain and gate regions. Field isolation regions 72a, 72b are formed to reduce parasitic field effects between neighboring transistor regions. While field isolation regions 72a, 72b are shown as LOCOS structures, other known structures may be used including isolation trenches or any other suitable isolation structures. Methods of processing control circuitry elements like MOS transistors are well known by those of skill in the art and are not detailed here.

In FIG. 8B a premetal dielectric layer 74, for example of silicon oxide, is formed over the silicon substrate 54 and the control circuitry 32. In practice the premetal dielectric layer 74 may contain multiple layers of dielectric materials including various silicon oxide layers, nitride layers, and planarizing layers. In a preferred embodiment the premetal dielectric layer 74 contains at least one layer of generally thermal insulator. For example, in one embodiment, a layer of silicon dioxide is present in the premetal dielectric while in other embodiments a nanoporous material or an aerogel is present. Silicon dioxide has a low thermal conductivity (about 1 W/m/K) and thus serves to inhibit heat transfer from structures above the premetal dielectric layer 74 to the transistors 70a-70c below the premetal dielectric layer 74. Aerogels and nanoporous layers are also good thermal insulators.

Often times it is advantageous to include in premetal dielectric layer 74 of one or more low-k dielectric layers to reduce capacitance between metal interconnections above and transistor structures 70a-70c below. The formation of premetal dielectric layers is well known in the art and is not further detailed here.

Figure 8C:
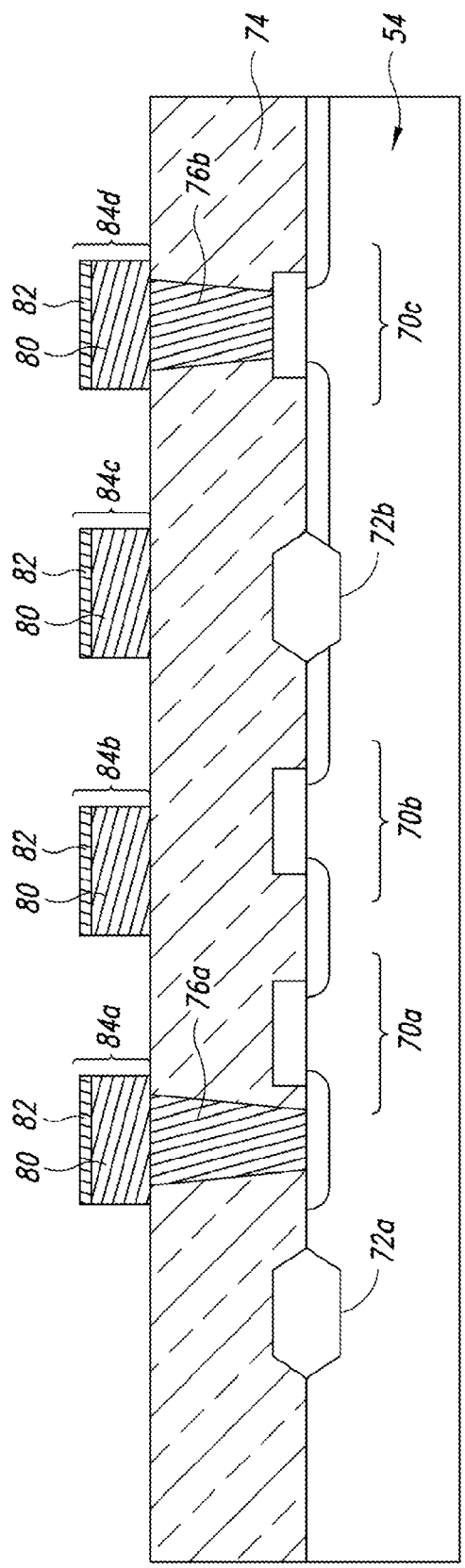

Plugs 76a, 76b are formed by appropriate etch and fill techniques well known in the art. For example, tungsten plugs may be formed. A metal one layer 80 (M1) is then deposited over the dielectric 74. Metal one is typically Al, but also may be Cu or any other suitable material. A thin anti-reflection metal layer 82 of TiN is formed on top of 80. In FIG. 8C layers 80, and 82 are etched leaving metal tracks 84a-84d.

In practice the formation of plugs 76a, 76b, and metal tracks 84a-84d may be done differently than shown in FIGS. 8A-8C. Plugs 76a, 76b may have a thin barrier layer of Ti and/or TiN lining the walls of the plugs. The plugs may be filled with W and planarized to be even with a top surface of 74. A thin layer of TiW or TiN may then be deposited over the surface of layer 74 prior to depositing Al layer 80. The thin TiW, TiN or other metal sublayers are not shown in detail because they are conventional. Any one of the many conventional methods and materials for forming metal interconnection lines, plugs, vias, barrier layers, and other conducting structures may be used. Such methods and materials are well known to those of skill in the art and will not be detailed here.

Figure 8D:
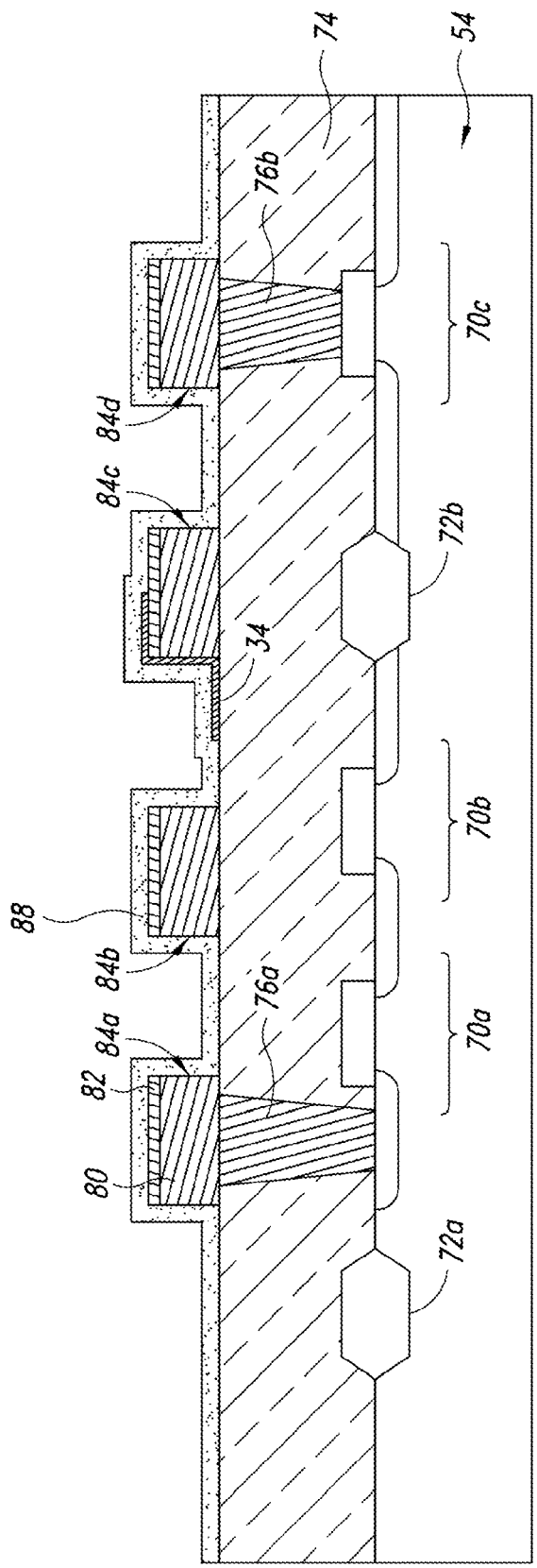

In FIG. 8D adjustable resistor 34 is formed by a thin film deposition of a resistive metal or other resistive material. In a preferred embodiment the adjustable thin film resistor 34 is formed by a blanket physical vapor deposition (PVD) process, for example sputtering. However, other processes are available for forming the thin film resistor including evaporation and other suitable thin film processes. The resistor layer 34 is then patterned and etched to the desired shape for each resistor. The adjustable thin film resistor 34 is formed with a portion on the premetal dielectric layer 74 and a portion contacting one or more metal tracks 84a-84d.

Numerous resistive materials may be utilized to form the adjustable resistor 34, including, but not limited to, metallic films like chromium silicon, nickel chromium, tantalum nitride, tantalum aluminum, and titanium nitride. These materials have better performance than conventional polysilicon resistors because they can form a wide range of sheet resistances, they have good tolerance, are easily reproducible, have low temperature coefficients of resistance, linear behavior, and low parasitic capacitance values. In a preferred embodiment the thin film resistor 34 is formed of chromium silicon between 5 and 15 nm thick. The thin film resistor 34 may comprise a single layer of chromium silicon or multiple layers of chromium silicon having differing concentrations of silicon.

Pure silicon may also be used for the resistor 34. For example, the silicon can be polysilicon, an amorphous silicon, or other form of silicon as deposited.

In one embodiment the adjustable resistor 34 has a low temperature coefficient of resistance over the range of temperatures at which the integrated circuit is likely to operate but may undergo a change in resistance if subjected to temperatures much higher than a normal operating temperature as described above. This change in resistance will be a permanent or semi-permanent change because upon cooling the resistor after a heating cycle, the resistance will be a new value and semi-permanent change because the resistance is altered from the value of resistance prior to the heating cycle. The resistance of the adjustable resistor 34 may again be altered again by subjecting the adjustable resistor 34 to higher than normal temperatures again. This phenomenon is to be distinguished from the phenomenon in which the resistance of most substances varies with temperature, but generally always returns to a same value for a same temperature. The particular materials for the resistor 34 are described in more detail elsewhere herein. Following is a brief summary of one embodiment.

In one embodiment, a layer of chromium silicon alloy is used for the adjustable resistor 34. The resistivity, measured as sheet resistance, of the chromium silicon varies based on the percentage of silicon in the chromium silicon alloy. In a preferred embodiment the adjustable resistor 34 is about 40% silicon and has a sheet resistance of 10 k$\Omega$/sq for a thickness of 15 nm. An adjustable resistor 34 of 10 sq has a resistance of about 100 k$\Omega$ in the unaltered state. Since the size in squares is not a term of absolute size, but of proportion of the width and length of the resistor, the size of the adjustable resistor can be scaled to a desired value.

In a preferred embodiment the chromium silicon thin film adjustable resistor 34 has a temperature coefficient of resistance that is very small, in one case substantially 0%/° C. over a temperature range of normal integrated circuit operation of 0° C. to 100° C. The temperature coefficient of resistance describes the percentage change in resistance per degree change in temperature. A smaller temperature coefficient of resistance means that the resistance changes very little with changes in temperature. The temperature coefficient of resistance of a chromium silicon thin film can be adjusted by altering the percentage of silicon in the chromium silicon alloy and by forming the adjustable resistor 34 from multiple layers of chromium silicon. Thus advantageously, the resistance of the adjustable resistor 34 changes very little with temperature in the normal operating temperature range, but can be permanently or semi-permanently altered by raising the temperature of the adjustable resistor 34 substantially higher than the normal operating temperature then cooling it again.

In one embodiment the chromium silicon undergoes a semi-permanent change in resistance when subjected to temperatures higher than 450° C. for the duration of 1 ms. The change in resistance is proportional to the magnitude of the temperature and duration for which the resistor is subjected to the temperature. In one embodiment the resistance of the chromium silicon thin film resistor 34 decreases when subjected to a heating cycle, as will be detailed later herein. In other embodiments the resistance of the chromium silicon resistor 34 increases when subjected to a heating cycle as will be detailed later herein.

The formation of thin film resistors, and in particular the formation of thin film chromium silicon resistors with low temperature coefficients of resistance and selected sheet resistances, is detailed in U.S. patent application Ser. Nos. 12/862,589, 12/862,594, 12/862,599 all of which are hereby incorporated by reference in their entireties. Processes for altering the resistance of thin film resistors by heating cycles are detailed in U.S. patent application Ser. No. 12/562,026 published as U.S. Patent Publication No. 2010-073122 A1, which is hereby incorporated by reference in its entirety.

A separation layer 88 of thermally conductive but electrically insulating material is conformally deposited over the exposed portions of the premetal dielectric 74, the conductive tracks 84a-84d, and the adjustable resistor 34. In a preferred embodiment layer 88 is silicon nitride having a thickness of about 100 nm and a thermal conductivity of approximately 20 W/m/K. In one embodiment layer 88 is a layer of silicon carbide having a thermal conductivity of 150 W/m/K.

In an alternative embodiment, after forming plugs 76a, 76b and prior to forming metal tracks 84a-84d, a layer of silicon carbide (not shown in FIG. 8D) is formed overlying the premetal dielectric 74. The metal tracks 84a-84d and the adjustable resistor 34 are then formed on the silicon carbide layer.

Figure 8E:
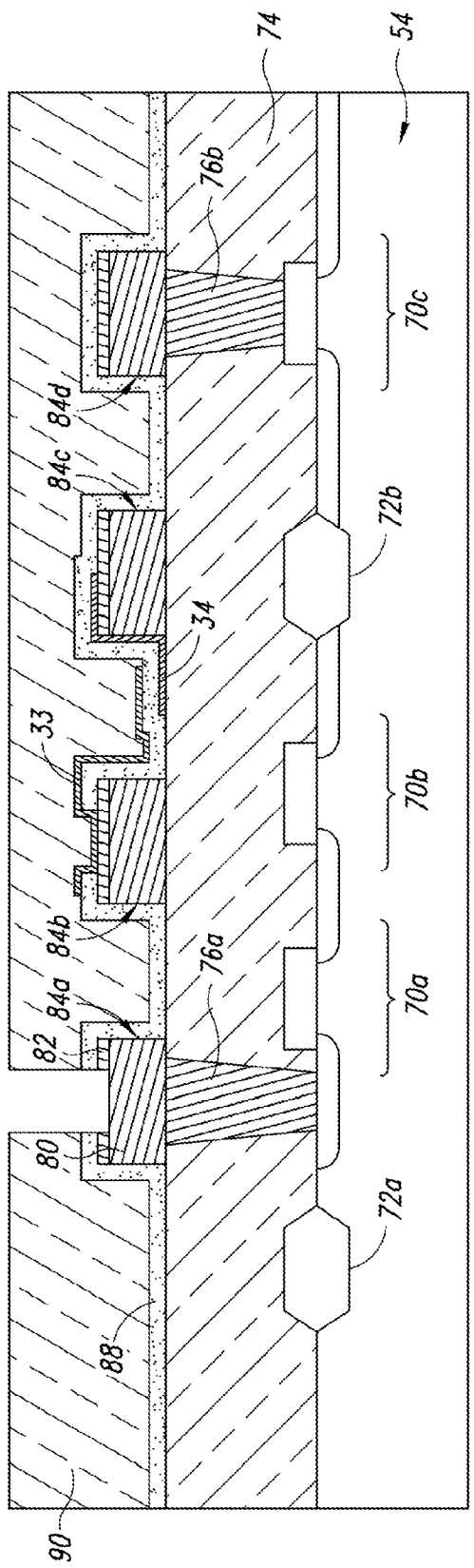

In FIG. 8E the separation layer 88 is etched to expose an upper surface of metal track 84b. Heating element 33 is then formed by depositing a thin film layer of heater material over the separation layer 88 and the exposed portion of metal track 84b. The heater material is etched to leave the heating element 33 as shown in FIG. 8E.

The material of the heating element 33 is generally different from the resistive material of the adjustable resistor 34. The material of the heating element 33 is selected to generate a large amount of heat when a current passes through it. Because the heating element 33 will generate and be subject to large amounts of heat, the resistive material of the heating element 33 is selected to be able to withstand high temperatures and stresses. Therefore in a preferred embodiment the heating element 33 is a refractory metal able to withstand high temperatures and currents without degrading. Refractory metals are able to sustain in a controlled manner a high temperature during heating. Furthermore, refractory metals are in general resistant to electro-migration of atoms when high currents pass through them. In a preferred embodiment the refractory metal is deposited by a PVD process such as sputtering or evaporation. Other suitable thin film techniques may also be used to form the heating element 33.

In a preferred embodiment the thin film heating element 33 is formed from a TaAl thin film. The thickness of the TaAl thin film heating element 33 is about 25 nm. The TaAl thin film heating element 33 has a sheet resistance of about 100 $\Omega$/sq for a total resistance of about 500 $\Omega$ (thus it is five squares). The material of the thin film heating element 33 may be selected from other refractory metals including but not limited to TaSiN, TaN, and W.

A dielectric layer 90 is then deposited over the heating element 33 and the separation layer 88. In a preferred embodiment the dielectric layer 90 is selected to have a low thermal conductivity so that heat from the heating element 33 is not easily transferred to structures above the heating element 33. In a preferred embodiment the dielectric layer 90 is a silicon oxide layer having a thermal conductivity of about 1 W/m/K. Other suitable materials may be used for the dielectric layer 90.

When the heating element 33 becomes hot, the separation layer 88 conducts heat from the heating element 33 to the adjustable resistor 34. For this reason the separation layer 88 is formed of a dielectric material selected to have high thermal conductivity. Because the separation layer 88 is thin and conducts heat very well, heat can be efficiently conducted from the heating element 33 to the adjustable resistor 34. In one embodiment, dielectric layers of the dielectric stack 56 that are not intended to thermally couple an adjustable resistor 34 to a heating element 33 are formed of dielectric materials having low thermal conductivity.

The embodiments described in relation to FIGS. 8A-8E are merely exemplary and can be modified in many ways. In practice there can be more or fewer process steps and many other materials can be used to implement an integrated circuit 30 according to embodiments of the invention in light of the present disclosure. For example, in FIGS. 8A-8E, only a part of the resistor 34 and heater 33 are shown, for ease of reference. As will be appreciated, each of these have a second electrical terminal besides the one shown for each of them so that they conduct current. They are coupled to the appropriate control circuitry as well.

In one embodiment an adjustable resistor 34 and a heating element 33 as disclosed in FIGS. 8A-8E comprise one memory cell 40 of a memory array 36. An array 36 of memory cells 40, as disclosed in FIG. 3, can be implemented according to one embodiment by forming a plurality of pairs of heating elements 33 and adjustable resistors 34 in rows and columns. It is advantageous to form the array 36 at about a same level as one of the metal levels at which metal interconnections are formed in the dielectric stack 56 because this permits the bitlines, wordlines, and other connections to the memory array 36 to be formed at the same time as the metal interconnections of the metal level at which the array 36 is formed. This advantageously cuts down on processing steps.

In other embodiments it may be advantageous to not form a memory array 36 at the metal one (M1) level of the dielectric stack 56 because it is possible that conducting lines that connect memory cells 40 to address circuitry 58 or control circuitry 32 may then need to be formed at the surface of the semiconductor substrate 54, using valuable surface area of the substrate 54. But rather the memory array 36 could be implemented at any other metal level of the dielectric stack 56 having n metal interconnect layers. In one embodiment it is advantageous to implement a first array of memory cells 36 at the level of metal two (M2).

Figure 9:
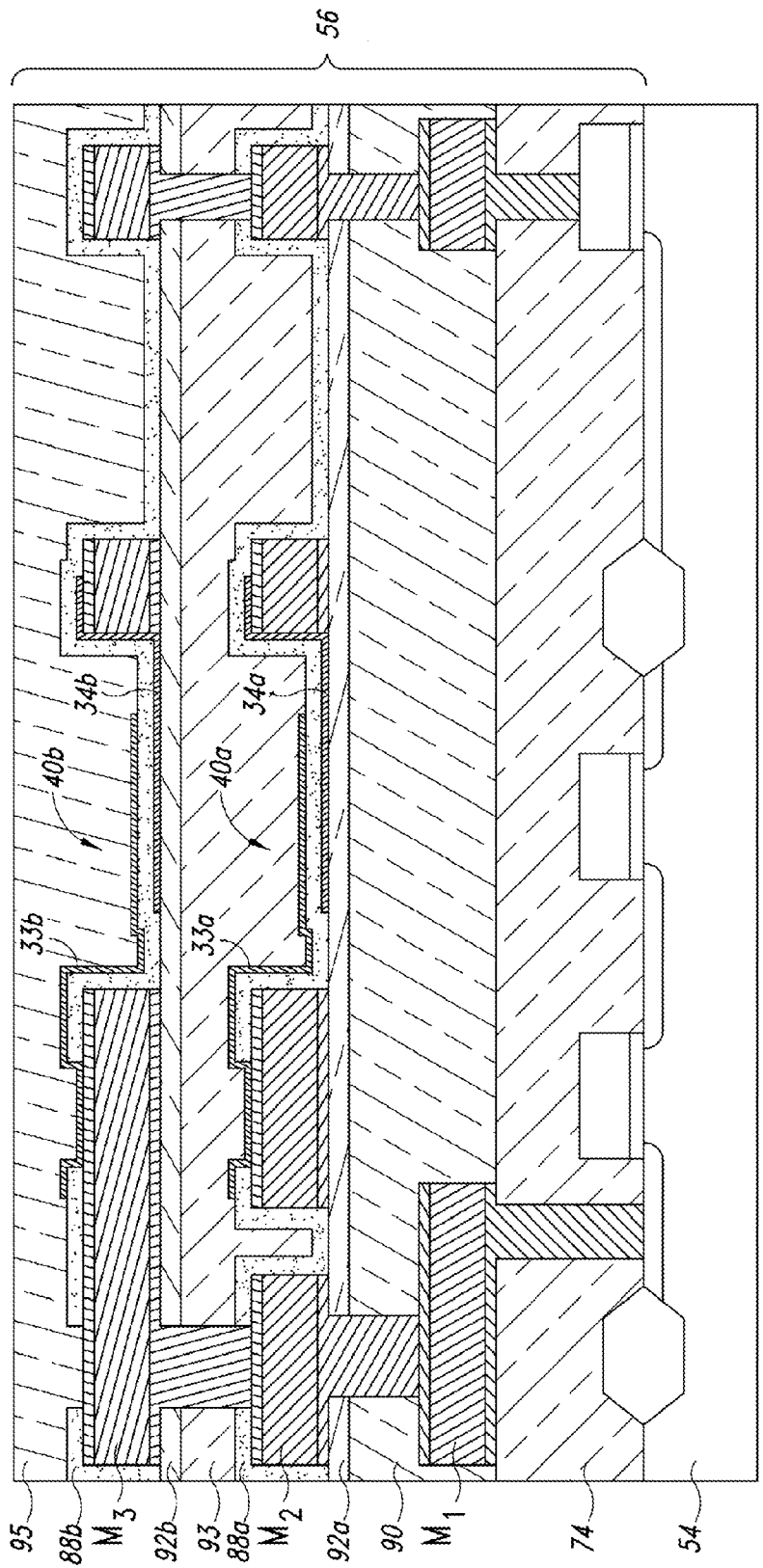
FIG. 9 is a cross section of an integrated circuit according to one embodiment.

FIG. 9 illustrates an integrated circuit having at least three metal layers according to one embodiment of the invention. Multiple memory arrays 36 are formed in the dielectric stack 56. FIG. 9 shows one memory cell 40a of a memory array 36a implemented at a level of the dielectric stack 56 at about metal layer M2 and one memory cell 40b of a memory array 36b implemented at a level of the dielectric stack at about to metal layer M3, above metal layer M2. The memory cells 40a, 40b may be substantially identical to those disclosed in FIGS. 8A-8E, but implemented at higher levels of the dielectric stack 56. The process for forming memory cells 40a, 40b may be substantially the same as for forming the heating element 33 and adjustable resistor 34 in FIG. 8A-8E, but performed at a later stage of the processing of the integrated circuit 30. Different from FIGS. 8A-8E.

FIG. 9 shows that adjustable resistor 34a is formed on a specifically selected dielectric layer 92a, for example of silicon carbide or silicon oxide. An additional layer 78 of TiN, TiW or other metal is also shown as part of the M1 layer stack. Dielectric layer 92a is formed on first inter-level dielectric layer 90. Adjustable resistor 34b is formed on dielectric layer 92b. Dielectric layer 92b is formed on second inter-level dielectric layer 93 and is, for example silicon carbide or silicon oxide. Third inter-level dielectric layer 95 is formed above heating element 33b. In a preferred embodiment inter-level dielectric layers 90, 93, 95 are selected from materials having low thermal conductivity, for example silicon oxide. This helps to inhibit undesirable heat transfer from a heater 33a or 33b to adjustable resistors, transistors, or metal layers above or below. Inter-level dielectric layers 90, 93, 95 may each be a single layer, for example an oxide layer, but in practice they each may include additional dielectric layers including oxide layers, nitride layers, oxynitride layers, silicon carbide layers, TEOS, planarizing layers, low k dielectric layers, or other dielectric layers.

While the memory cell 40b has been shown to be formed directly above the memory cell 40a, in practice the memory cells 40a, 40b will be offset laterally from each other to further increase the distance between the cells and inhibit one memory cell from erroneously writing another. Thus it may be advantageous to laterally offset the memory cells in one array from another directly above or below it in order to ensure that no heating element 33 of one memory cell 40 can erroneously heat an adjustable resistor 34 of another cell enough to alter the resistance of the adjustable resistor 34 of the other memory cell 40.

Figure 10A:
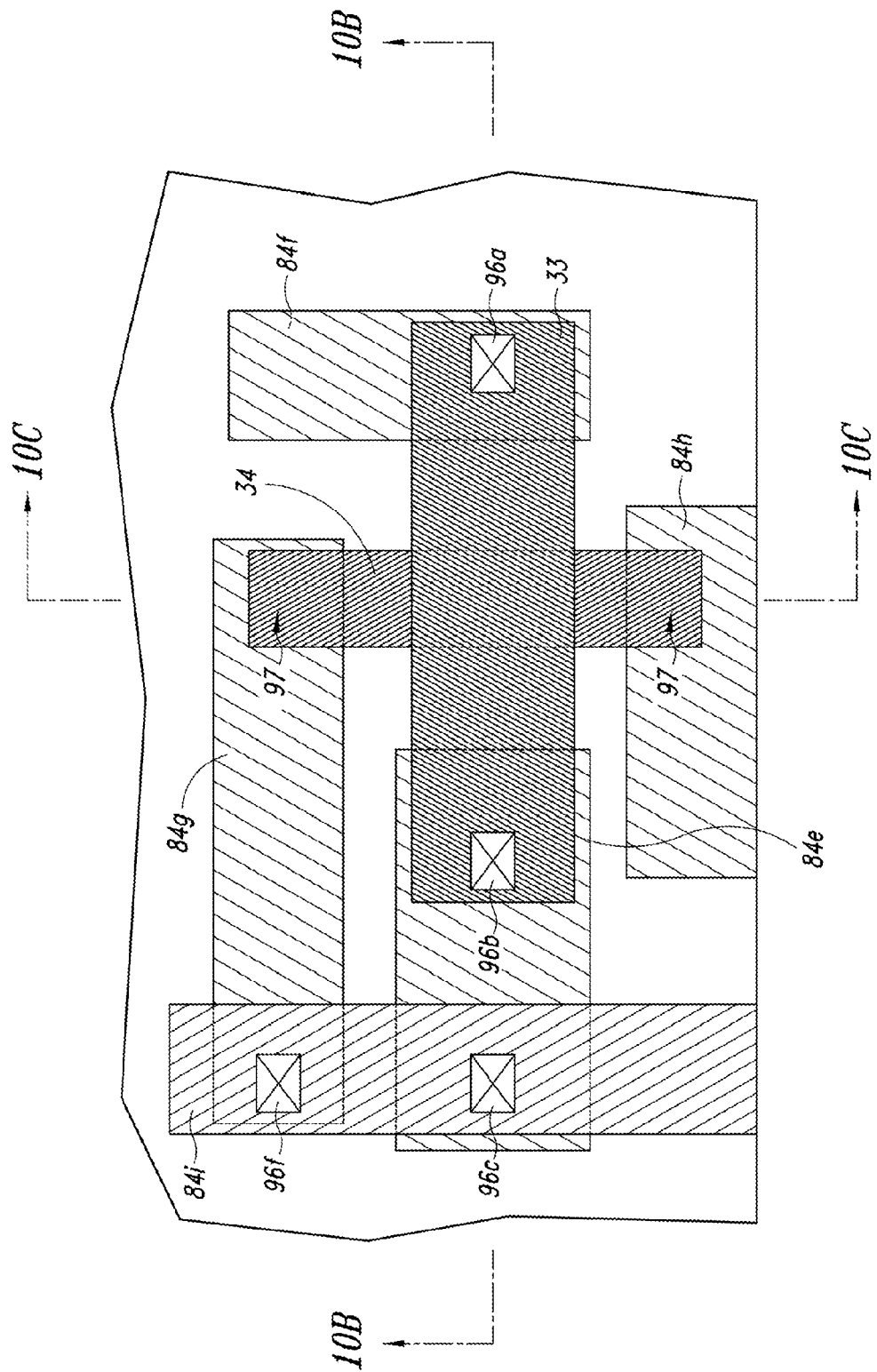
FIG. 10A is a top view of a layout of a memory cell according to one embodiment.

FIG. 10A is layout view of an adjustable resistor 34 and a heating element 33 according to one embodiment. FIG. 10A illustrates the simplicity with which a single memory cell 40 can be realized according to one embodiment of the invention. A memory cell 40 consists of a single thin film adjustable resistor 34 and a single thin film heating element 33 each contacting respective metal interconnections 84e-84h. Contacts 96a, 96b represent regions where the heater 33 contacts interconnection lines 84e-84f. At 97a, 97b the resistor 34 electrically connects to metal 84h, no via is needed because it is formed directly on the metal layer. Because the thin films 33, 34 are so thin, they can be formed at practically the same level as the metal interconnections 84e-84h to which they are connected. This eliminates the need for forming deep vias and plugs between the thin films 33, 34 and the metal interconnections 84e-84h. Rather, the thin films 33, 34 can directly contact the metal interconnections 84e-84h.

Figure 10B:
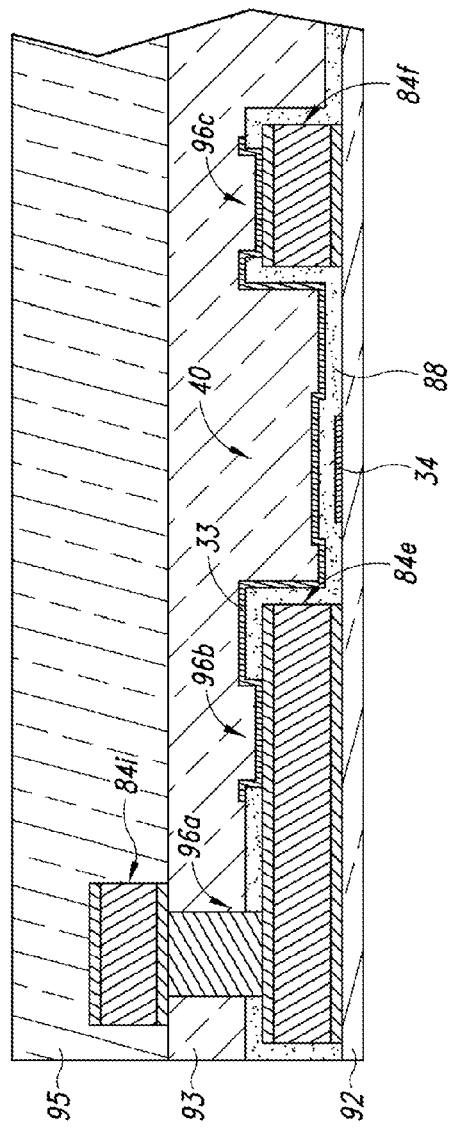
FIG. 10B is a cross section taken along lines 10B-10B of the memory cell of FIG. 10A.

FIG. 10B is a cross section of FIG. 10A taken through line 10B-10B. In FIG. 10B heating element 33 overlies a portion of adjustable resistor 34 with separation layer 88 between heating element 33 and adjustable resistor 34. Only a small portion of heating element 33 is directly above the adjustable resistor 34. This allows for a more easily controlled heat transfer and helps prevent the possibility that the heating element 33 overheats the adjustable resistor 34 and destroys it. Adjustable resistor 34 is formed on dielectric layer 92. Dielectric layer 92 is for example silicon carbide, or a very dense format of silicon oxide. Adjustable resistor 34 extends lengthwise into the plane of FIG. 10B. Heating element 33 contacts metal tracks 84f, 84e at contact regions 96a, 96b respectively. Inter-level dielectric layers 93, 95 overly heating element 33 and may be of any suitable dielectric material as previously discussed.

Figure 10C:
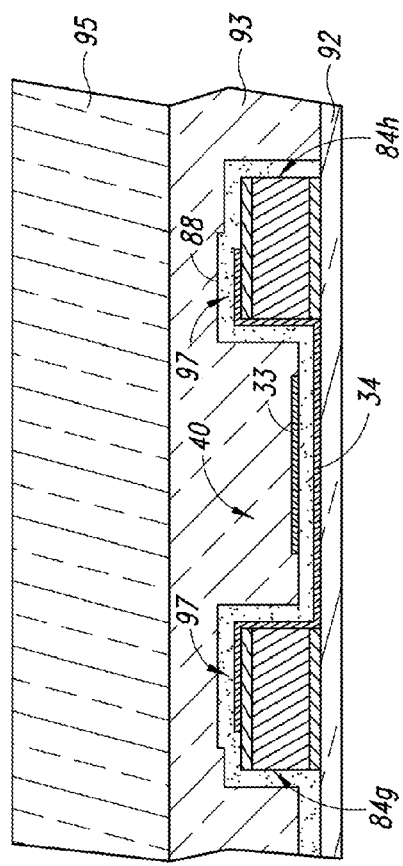
FIG. 10C is a cross section taken along lines 10C-10C of the memory cell of FIG. 10A.

FIG. 10C shows a cross section of the memory cell 40 of FIG. 10A taken along line 10C-100 and is perpendicular to the cross section shown in FIG. 10B. In this figure the heating element 33 extends lengthwise into the page. Adjustable resistor 34 contacts metal tracks 84g, 84h at contact points 97a, 97b respectively.

Figure 10D:
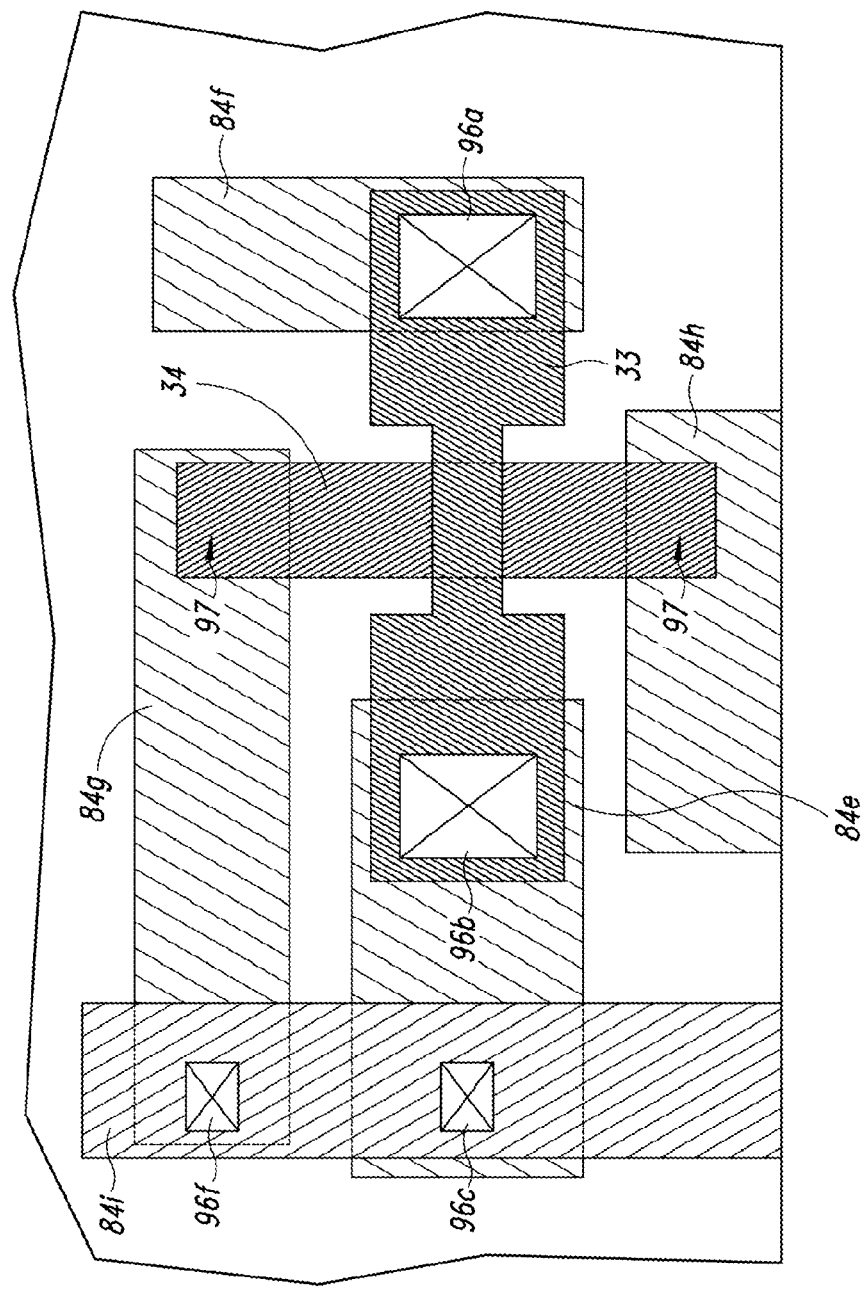
FIG. 10D is an alternative embodiment of the heating element in an exemplary memory cell.

FIG. 10D illustrates an alternative embodiment for the heating element 33. In the alternative embodiment, the vias 96a, 96b are enlarged to provide increased surface area for having a low resistance electrical contact between the metal lines 84e, 84f and the heating element 33. This reduces the amount of heat that will be generated at the interface between the metal layer and the heater. The heating element has a large surface area at the region where it electrically connects to the metal lines and adjacent thereto. In a region 99 which is positioned over the adjustable resistor 34, the heating element 33 has a substantially narrowed region. The narrowed region 99 will have a much higher current density than the wider region of the heater 33. Accordingly, the region 99 will reach a high temperature much more quickly and with less overall current. The enlarged portions of region 33 will remain relatively cool, and below 400° C. while the narrowed region 99 will rapidly reach the high temperature needed in order to alter the resistance of the adjustable resistor 34. The structure of FIG. 10D increases the life of the circuit and enhances the reliability of the electrical connection between the heating layer 33 and the metal layers 84e and 84f to which it is coupled. Since a more narrow region of the adjustable resistor 34 is being affected by the heating resistor, the range of different resistances over which data may be reliably stored may be somewhat less than that which would be available if a wider zone of adjustable resistor 34 were having its resistance altered. This can be modified by increasing the area of the neck 99 to substantially cover a majority of the adjustable region 34 while at the same time enlarging even greater the electrical contact regions 96a and 96b, potentially being substantially larger than the area of adjustable resistor 34. In addition, the region 99 can be a serpentine shape of the type disclosed in U.S. Patent Publication No. 2010/0073122, FIG. 13, having the contacts enlarged and the cross-sectional area of the heater much larger closely adjacent its contacts so that the contact region itself is not heated to as high a temperature as that portion of the heater which is directly over the adjustable resistor 34.

Figure 11:
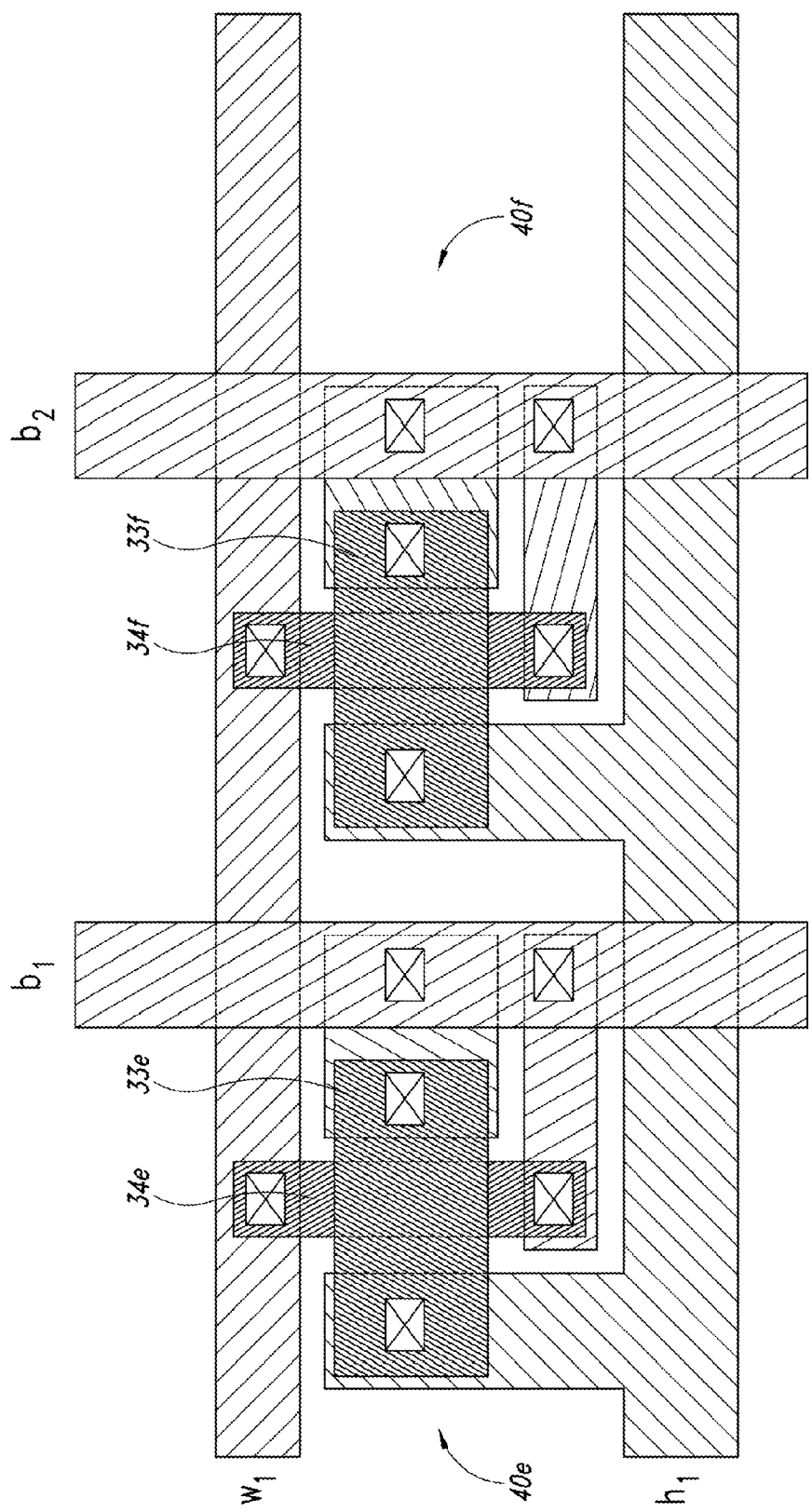
FIG. 11 is a top view of a layout of a portion of a memory array according to one embodiment.

FIG. 11 is a layout of a portion of a memory array 36 according to one embodiment of the invention. Two memory cells 40e, 40f are shown. The adjustable resistor 34e and heating element 33e of memory cell 40e are both connected to a first bitline b1. Adjustable resistor 34f and heating element 33f are both connected to a second bitline b2. The adjustable resistors 34e, 34f are both connected to a first wordline w1. The heating elements 33e, 33f are both connected to a first heater line h1. Memory cells 40e, 40f therefore lie on a same row of memory cells in a memory array 36. A heater line h1 enables a write current to pass through one or both of heating elements 33e, 33f during a write cycle. During a write cycle a voltage difference can be generated between heater line h1 and the bitline selected for the write cycle. In this example bitline b1 is selected for the write cycle and the bitline is taken to ground. The voltage difference between h1 and b1 will cause a large current to flow through the heating element 33e and generates heat. Adjustable resistor 34e is heated, causing it to undergo a structural change that will alter its resistance as described above. In practice, both b1 and b2 could be selected at the same time in order to simultaneously write data to adjustable resistors 34e and 34f.

Figure 12:
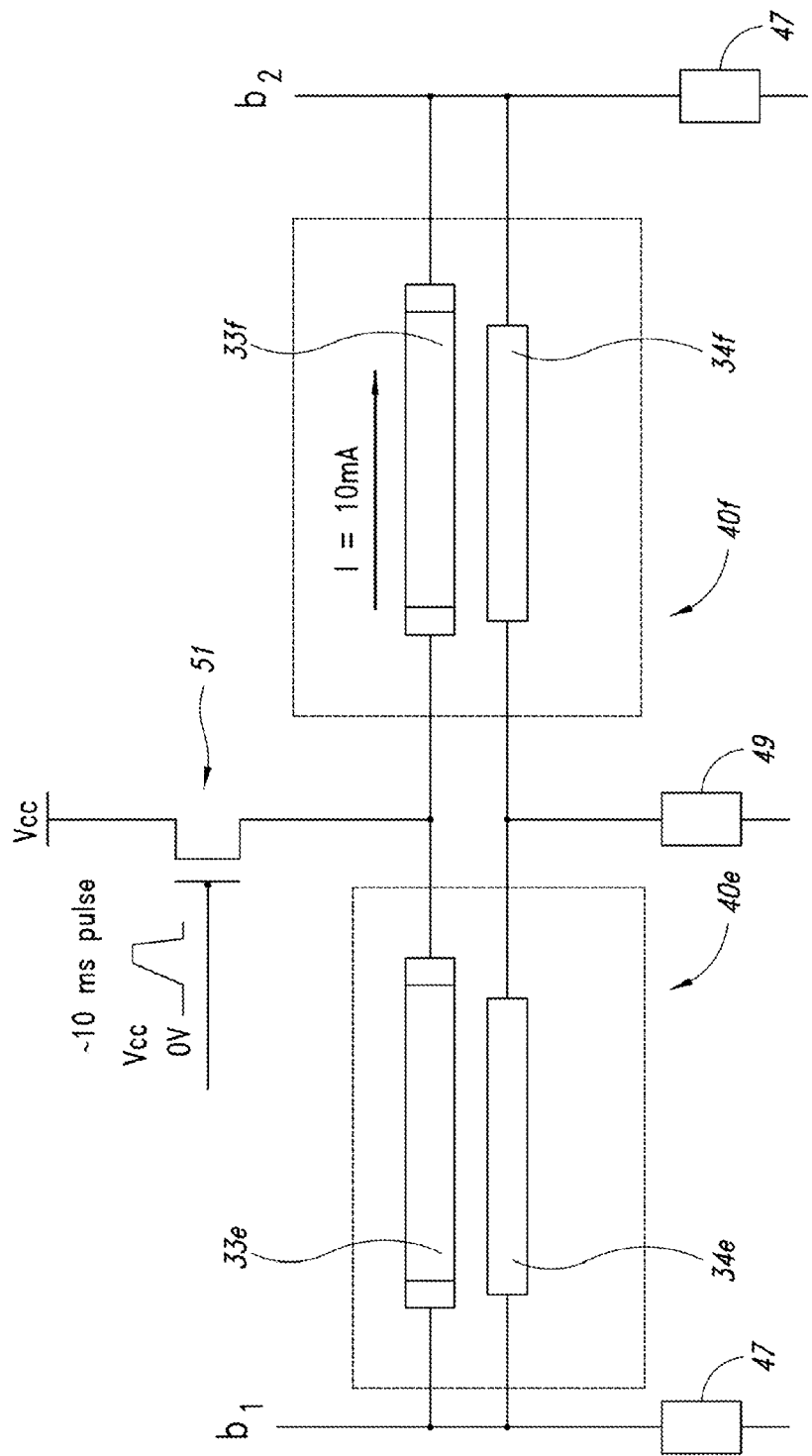
FIG. 12 is circuit diagram illustrating a write process of a memory cell according to one embodiment.

The value on the bitlines does not need to ground for both bitlines. It is possible for bitline b1 to go to ground and bitline b2 to go to a mid level voltage, thus heating the resistors to a different temperature and storing different data in the respective memory cells on the same write cycle. FIG. 12 is a partial circuit diagram of memory cells 40e, 40f and illustrates a process for writing data to memory cell 40f while leaving memory cell 40e unprogrammed according to one embodiment of the invention. To program memory cell 40f, bitline b2 is connected to ground via switch 47, bitline b1 left open by leaving its switch 47 open and wordline switch 49 is also open so as to not receive a current. The heater line h1 is brought high to Vcc (for example 5V) for about 10 ms by applying a high pulse slightly above Vcc to a gate of switch s1. During this 10 ms pulse, a 10 mA current flows through heating element 33f causing it to generate heat. This heat is conducted to adjustable resistor 34f causing the temperature of adjustable resistor 34f to increase to about 500° C. The high temperature of the adjustable resistor 34f causes the resistance of the adjustable resistor 34 to be permanently or semi-permanently altered. When the adjustable resistor 34 is cooled, the resistance of the adjustable resistor 34 has decreased from an original value of 100 kΩ to an adjusted value of 70 kΩ. In other embodiments of the invention, a programming sequence may increase the resistance of an adjustable resistor 34. The values of resistance and temperature are given only by way of non-limiting example, other values could also be used. In the embodiment of FIG. 10, only a very small leakage current has flowed through heating element 33e, thus leaving adjustable resistor 34e unprogrammed. The small current is due to the fact that some current may flow from h1 (at Vcc) through 33e, 34e, and 34f to b1 (at GND). The current is however very small due to the large resistances of adjustable resistances 34e, 34f, therefore heating element 33e does not generate enough heat to program adjustable resistor 34e.

Figure 13:
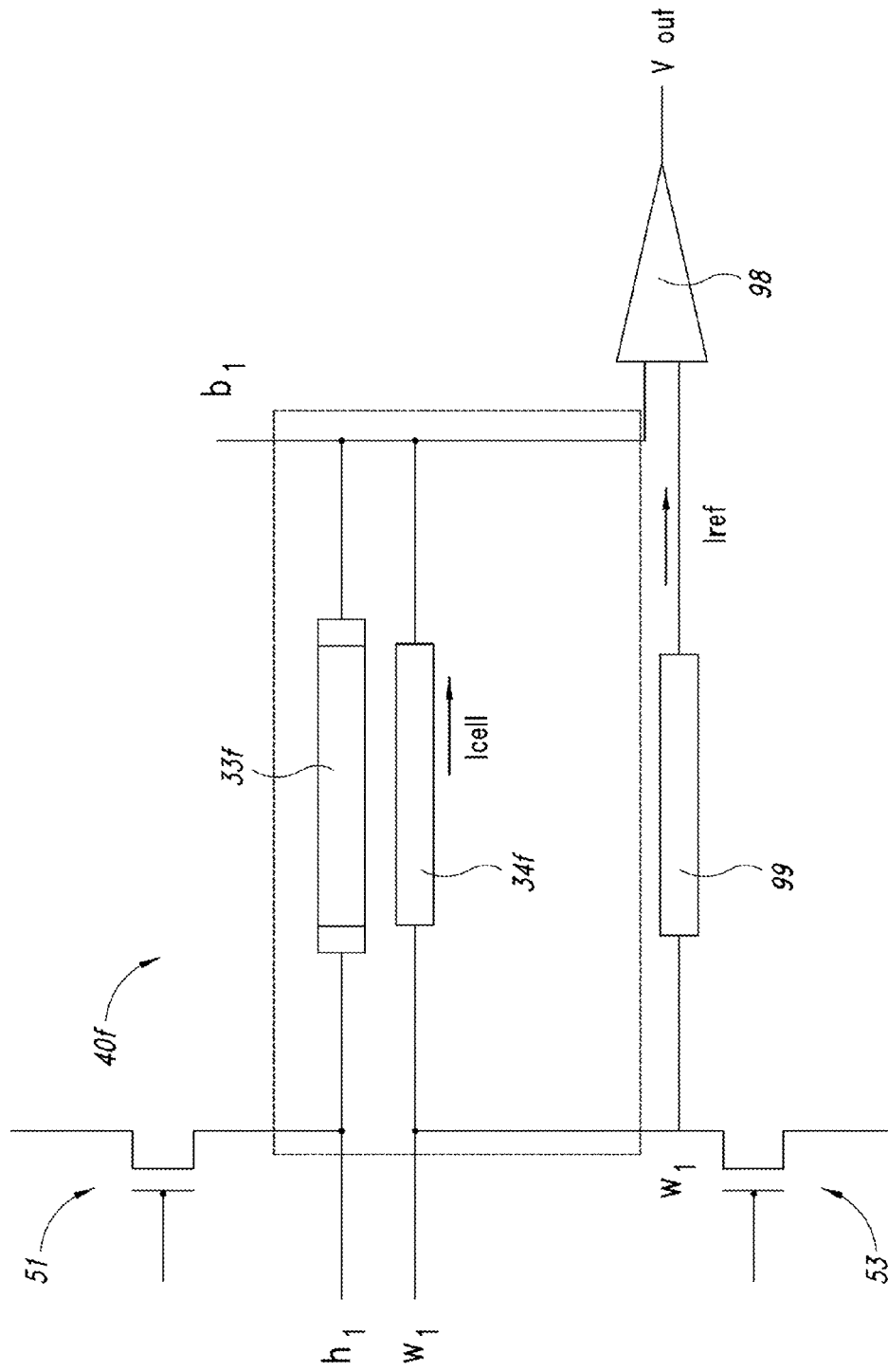
FIG. 13 is a circuit diagram illustrating a read process of a memory cell according to one embodiment.

FIG. 13 is a partial circuit diagram illustrating one possible process for reading from memory cell 34f according to one embodiment of the invention. Bitline b2 is grounded and wordline w1 is brought high via either switch 49 or 53, causing a current to flow through adjustable resistor 34f. The current through 34f is input to a current comparator 98. The current comparator 98 compares the current through adjustable resistor 34f to a control current through an unprogrammed reference resistor 99. The comparator 98 then outputs a voltage Vout indicative of the value stored in the memory cell 40f. The heater switch 51 is left open. Many other schemes for reading and programming memory cells 40 are possible and will be apparent to those of skill in the art in light of the present disclosure.

FIG. 14 is a partial circuit diagram of an array 36 of memory cells $40_{1,1}$-$40_{n,m}$ arranged in n rows and m columns. Bitlines $b_1$ through $b_m$ are disposed along the columns of memory cells. Each bitline is connected to all of the memory cells 40 of a given column. For example, bitline b1 is connected to all of the memory cells $40_{1,1}$-$40_{n,1}$ in the first column of memory cells. In particular, bitline b1 is connected to the respective heating element 33 and adjustable resistor 34 of each memory cell 40 in column 1.

A plurality of heater lines h1-hn each connect to all of the heating elements 33 of respective row of memory cells 40. For example, heater line h1 connects to heating elements 33 of the memory cells $40_{1,1}$-$40_{1,m}$ in the first row of memory cells. As discussed previously, the heater lines h1-hn, in connection with bitlines b1-bm allow for programming individual ones of the memory cells 40 or a group of memory cells.

A plurality of wordlines w1-wn connect to all of the adjustable resistors 34 in a same row. For example, wordline w1 connects to all adjustable resistors 34 of the memory cells $40_{1,1}$-$40_{1,m}$ in the first row of memory cells. As discussed previously, the wordlines, in connection with the bitlines, allow for the reading of the memory cells 40. In one embodiment separate bitlines are provided for the heaters and resistors in each memory cell. This provides increased electrical isolation of the heaters 33 and resistors 33 and also control over certain aspects of their operation by consuming more area. Either the single bitline per memory cell or the double bitline per memory cell may be used, depending on size limitations and design goals.

In one embodiment address circuitry 58 including switches 47, 49, 51, and 53 for selecting particular memory cells 40 for read and write operations is located at the surface of the semiconductor substrate 54. Address circuitry 58 is configured to connect wordlines, bitlines, and heater lines to selected voltages for performing read and write operations.

The memory array 36 of FIG. 14 illustrates a particularly advantageous feature of one embodiment of the invention. Traditional EPROM, EEPROM, and FLASH memory cells all utilize at least one transistor with a floating gate for storing data. Each memory cell of a traditional EPROM, EEPROM, or flash memory cell also includes one or more access transistors in addition to the floating gate transistor. The embodiment of FIG. 14 not only eliminates the floating gate transistor, but also access transistors in individual cells. Access transistors for disconnecting or connecting bitlines, wordlines, or heater lines to appropriate supply voltages may be present at the substrate and may consist of one or more transistors per line. But it is not necessary to form separate transistors for each memory cell 40. This permits the entire memory array of FIG. 14 to be formed spaced away from the surface of the semiconductor substrate, for example at a metal interconnection level. Real estate at the surface of the semiconductor substrate is then freed to allow greater circuit complexity for control circuitry 32 if desired, or to reduce the area of the integrated circuit 30 altogether.

In one embodiment a write cycle consists of a 10 ms current pulse delivered to a heating element 33. In terms of typical write speeds for prior forms of memory, 10 ms is quite slow and thus programming of the array 36 may take longer than prior memories. However, an advantage of the present memory array 36 is that the memory can be read very quickly. When a floating gate memory cell of a traditional memory array is read, the read speed is limited in part by the time required to switch the gate of the floating gate transistor and the access transistors of each memory cell to a conducting state. In an adjustable resistor memory array 36 according to one embodiment of the present invention a memory cell 40 can be read very rapidly since only the value of a passive element, a resistor, is sensed in the memory cell 40. In an embodiment where the memory array is preprogrammed and/or one-time programmable, the relatively long programming cycle is not problematic and the overall invention is beneficial in view of the high speed of subsequent read cycles, of which there will be many in the lifetime of an integrated circuit 30. Furthermore, in other embodiments it is possible to reduce the write time to less than 1 µs. During a write cycle, the adjustable resistor 34 reaches a temperature of about 360° C. in about 50 ns, and reaches 500° C. in about ~1 ms. Thus as write temperatures decrease, much lower write times can be achieved.

Furthermore, an integrated circuit can contain multiple memory arrays 36 formed at different levels of the dielectric stack 56 of the integrated circuit 30. A typical integrated circuit 30 using a five metal process could incorporate five arrays 36 of memory cells 40 above the substrate 54 in the dielectric stack 56 according to one embodiment. However, as described above, in a preferred embodiment there is not an array 36 of memory cells 40 at the level of metal one.

Figure 15:
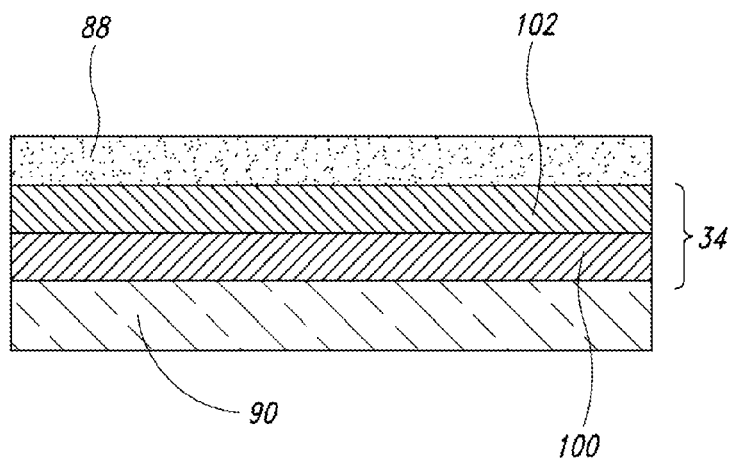
FIG. 15 is a cross section of a thin film adjustable resistor according to one embodiment.

FIG. 15 is a cross section of a portion of adjustable resistor 34 according to one embodiment of the invention. The dual thin film adjustable resistor 34 may be formed in substantially the same manner as described in relation to FIGS. 8A-8E, but the deposition takes place in two phases. The adjustable resistor 34 is a dual layer of chromium silicon deposited then etched to leave the adjustable resistor 34 in the desired final form. To form the dual layer chromium silicon adjustable resistor 34 of FIG. 15, a first chromium silicon layer 100 is formed on dielectric layer 90 of $SiO_2$. The first layer 100 is formed by PVD, for example by sputtering a target comprising 45% Si, 20% $CrB_2$, and 35% SiC by weight. The first layer 100 is about 10 nm thick and comprises about 45% Si and 20% Cr. The remaining 35% can be composed of Boron, Carbon, or other elements. A second chromium silicon layer 102 is then formed on top of the first layer 100 by a second PVD process, for example by sputtering a target material comprising 10% Si, 85% $CrB_2$, and 5% SiC. The layer will therefore be 10% Si, about 80-85% Cr and the remainder a combination of B and C. The second chromium silicon layer 102 is for example about 5 nm thick. A process for forming these layers is described in aforementioned pending U.S. patent application Nos. having Ser. Nos. 12/862,589, 12,862, 594, and 12/862,599.

Figure 16:
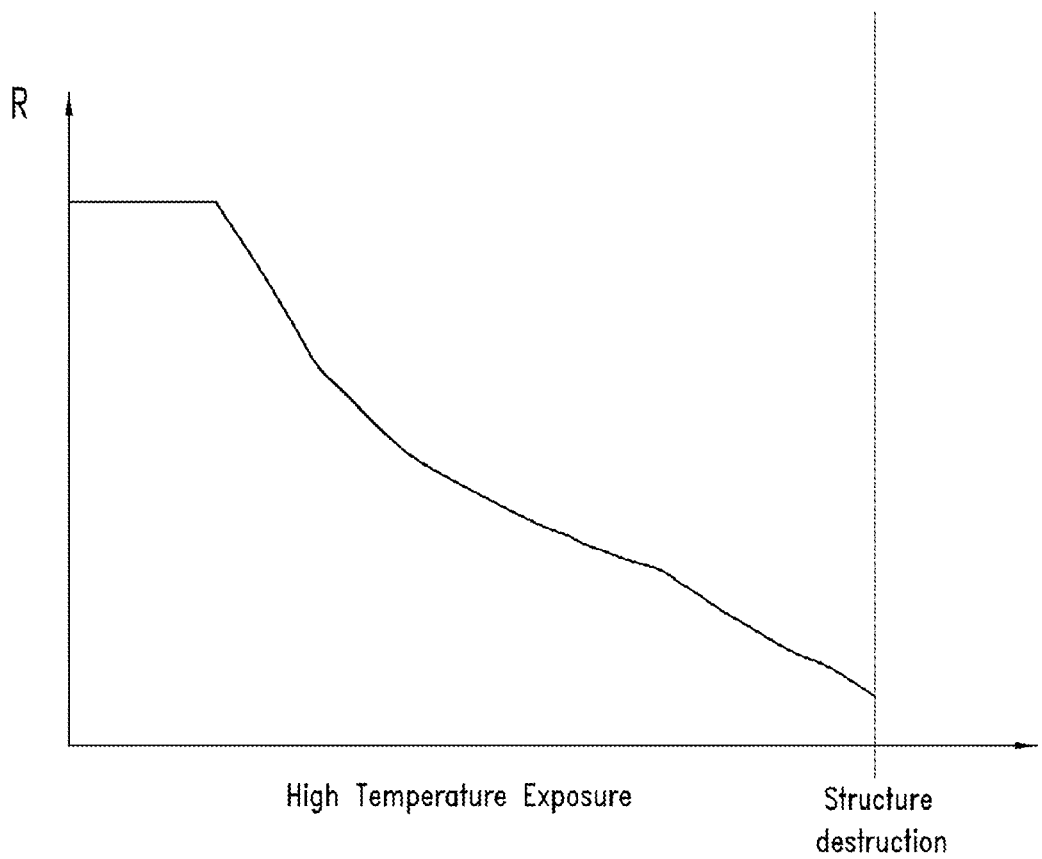
FIG. 16 is a graph of the resistivity changes over temperature variations of an adjustable resistor according to one embodiment.

FIG. 16 is a curve showing the change in resistance in the dual thin film adjustable resistor 34 of FIG. 15 as more heat is applied to the resistor 34. It can be seen from this curve that as the adjustable resistor 34 is subjected to higher temperatures, the resistivity of the adjustable resistor 34 drops. After applying heat to the adjustable resistor 34 to drop the resistance, the resistance of the adjustable resistor 34 can be further lowered by applying heat a second time to the adjustable resistor 34. The heat can be applied in one continuous time or in stages, over subsequent steps. However, each drop in resistance is irreversible. In other words, after the resistance has been lowered, it cannot be raised again, it can only be lowered further. Advantageously, the resistance of the adjustable resistor 34 can be altered very precisely in small increments. For example changes as small as 1% of the total resistance can be reliably achieved by performing shorter programming cycles. In one embodiment the maximum change in resistance of the resistor is about 30-50% of the original value before the resistor is destroyed. Thus if too much heat is applied for too long the adjustable resistor 34 will be destroyed.

From the discussion above it can be seen that it is possible to store more than one bit of data in a single adjustable resistor 34. It is possible to reliably lower the resistance of the adjustable resistor 34 in increments as small as 1% by properly selecting the amount of current to apply to the thin film heating element 33 and by selecting the proper duration to apply the current.

Figure 17:
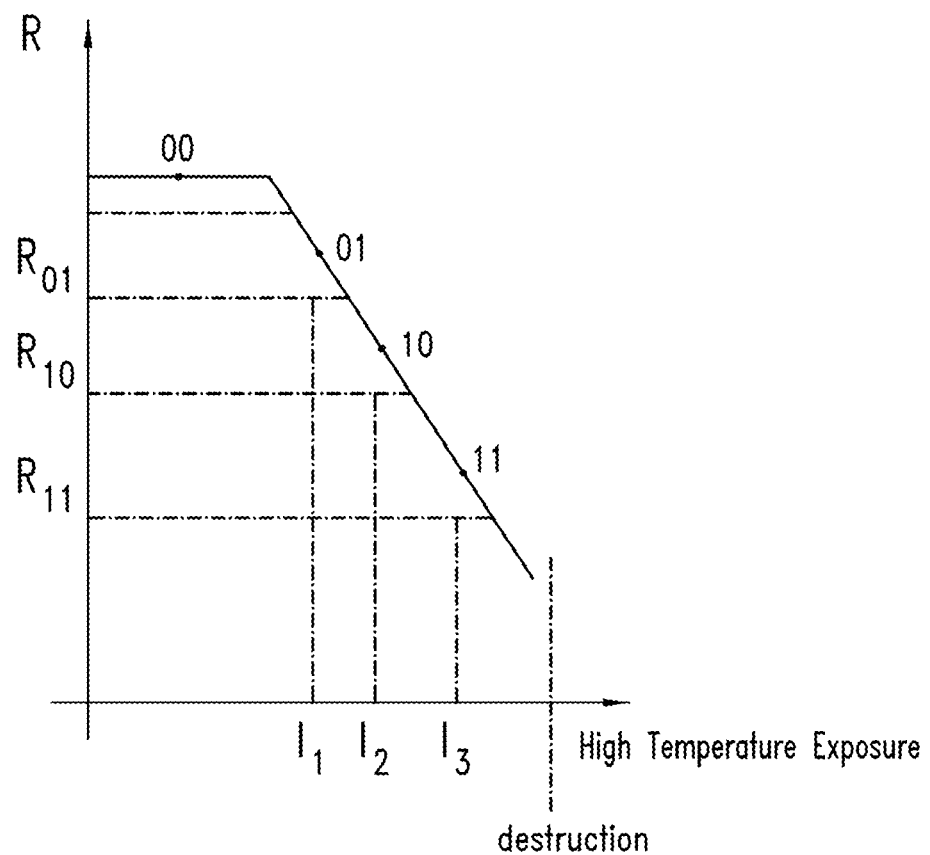
FIG. 17 is a diagram of programming states of a multi-bit adjustable resistor according to one embodiment.

FIG. 17 illustrates an embodiment in which the adjustable resistor 34 forms a two bit memory cell. The resistance variation line 121 has been simplified to be shown as a straight line of constant slope for ease of reference. In the unwritten state the resistance has not been altered and this level of resistance corresponds to data value 00 being stored in the thin film resistor 34. By applying a current I1 to the heating element 33, the adjustable resistor 34 is heated and the resistance lowered to the level corresponding to data 01. By subsequently applying current I2 (or by applying I2 during the first write cycle), the resistance is lowered to the level corresponding to data 10. By subsequently applying current I3 (or by applying I3 for the first or second write cycle) the resistance is lowered to the level corresponding to data value 11. In this way a single adjustable resistor 34 can store two bits of data, thus doubling the memory capacity of an array 36 of adjustable resistors 34.

Horizontal dotted lines illustrate the ranges over which the resistance will be read as a particular value. For example, an adjustable resistor 34 having resistance in the range of $R_{01}$ will be read as having value 01. An adjustable resistor 34 having resistance in the range $R_{10}$ will be read as having data value 10, and so forth. A resistance having current I1, centered in the middle of range $R_{01}$ is preferred, but any current within the range of $R_{01}$ that may deviate by some amount from central current I1 will still be read as 01 in value. This illustrates the need for the ability to reliably alter the resistance of the adjustable resistors 34 in precise increments. The more precisely the adjustable resistors 34 can be altered, the more bits of data can be stored in the adjustable resistors 34. For proper function of the memory array 36, the number of bits stored in each adjustable resistor 34 should be chosen so that the likely range of resistance that will result from a particular write cycle will not overlap with the likely range of resistance from either of the next lowest or next highest data values. Those of skill in the art will see that many schemes for reading and assigning values to the resistance levels are possible in light of the present disclosure.

Figure 18:
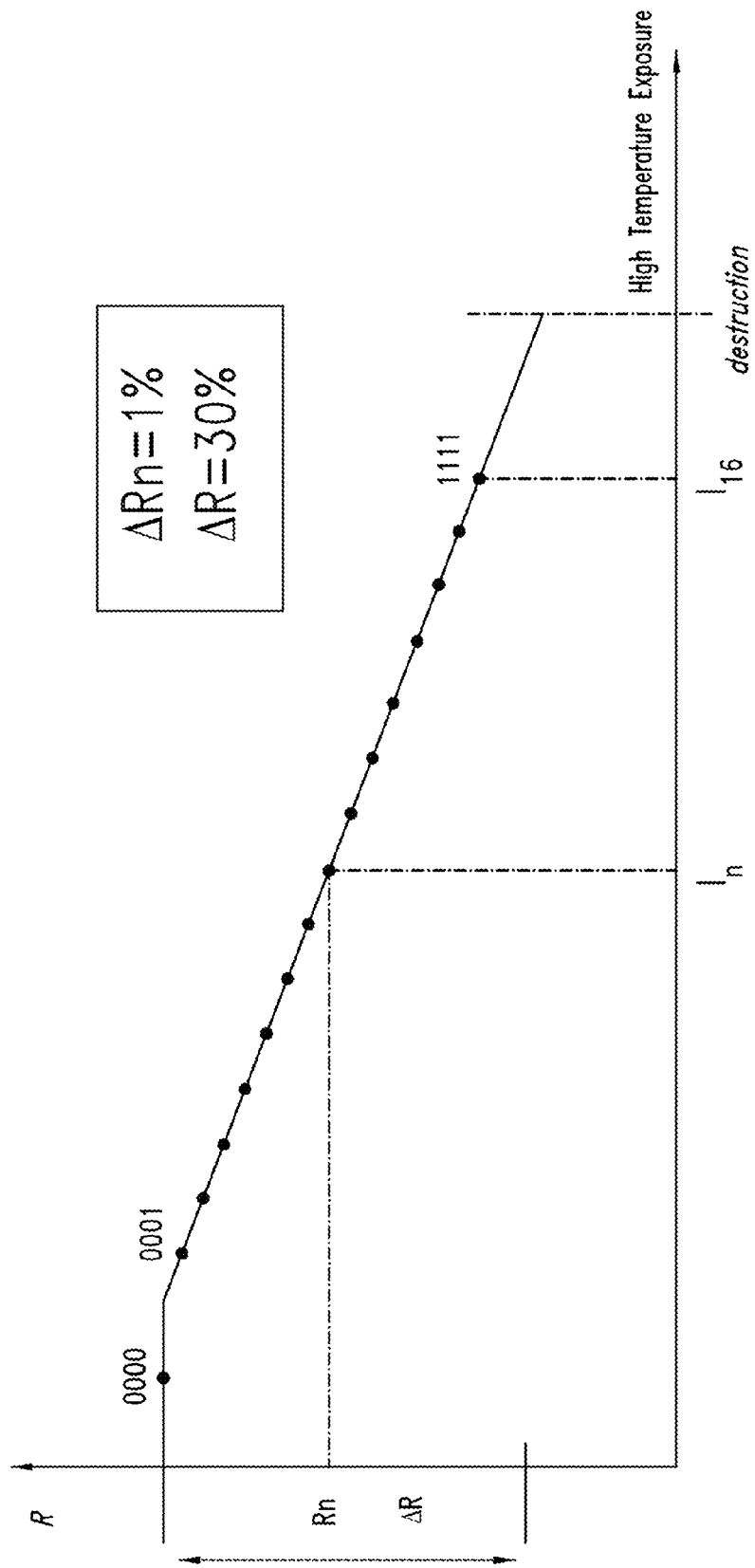
FIG. 18 is a diagram of programming states of a multi-bit adjustable resistor according to one embodiment.

The number of bits that can be stored in each adjustable resistor 34 is not limited to two. But rather is based partly on the smallest increment by which an adjustable resistor 34 can reliably be altered and read. As mentioned above, the adjustable resistor 34 of FIG. 15 can be reliably reduced in steps of 1% of the initial resistance. FIG. 18 illustrates an embodiment in which each adjustable resistor 34 can store four bits. By lowering the resistance in steps of 1% or 2%, it is possible to reliably write and distinguish 16 or more different states of adjustable resistor 34 before the adjustable resistor 34 is destroyed by altering the resistance more than 30% from the original value. In FIG. 18, the value 0001 represents the minimum heat used to modify the thin film resistivity. Applying the smallest programming value of energy to the heating element 33 will lower the resistance of the adjustable resistor 34 to a resistance corresponding to data value 0001. Applying other current levels will allow for programming the adjustable resistor with any value up to 1111.

Because each writing process is irreversible, the adjustable resistor 34 of FIGS. 15-18 can be used in security memories in which it is desirable for the state of memory cells to not be resettable. Reapplying a previous current value will not reset the value of the memory cell. This can be advantageous for devices like smart cards or other RF devices that will store values in memory that represent the amount of money or credits left on a card. The inability to reset the memory makes the device secure from many types of fraud.

Figure 19:
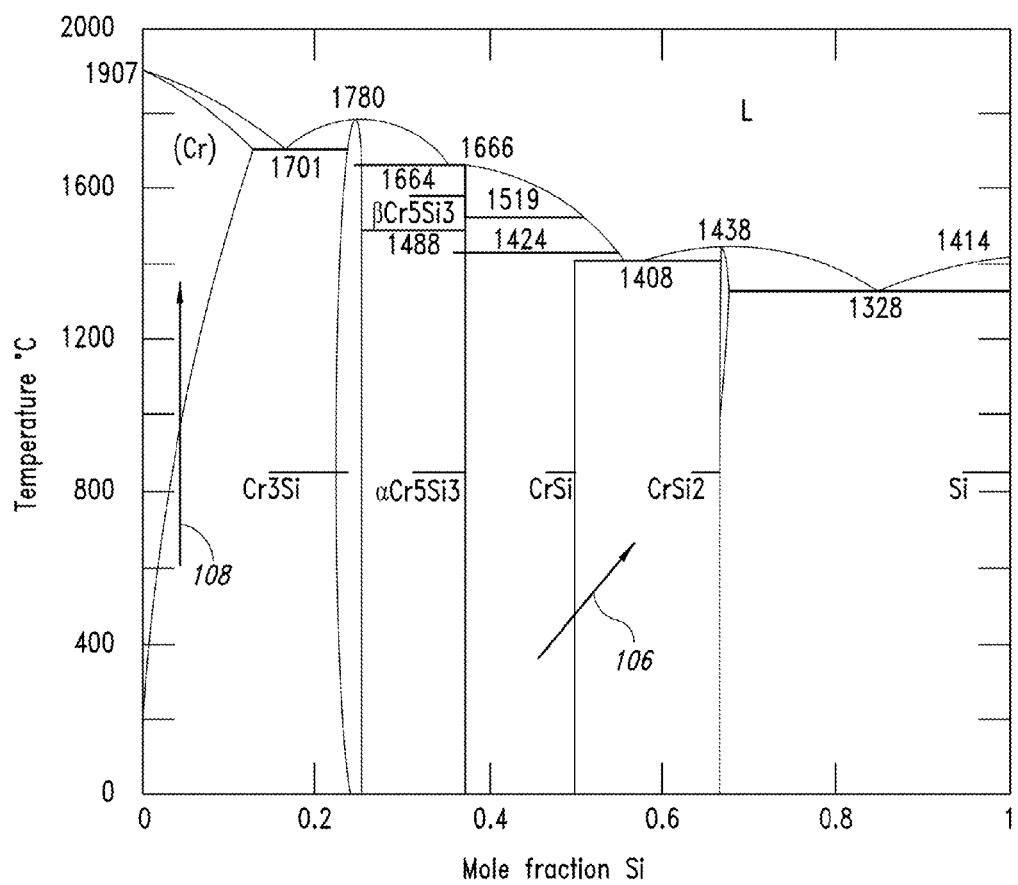
FIG. 19 is phase diagram of chromium silicon alloys.

FIG. 19 is a phase diagram that illustrates the mechanism believed responsible for the change in resistance in the dual film silicon chromium resistor illustrated in FIG. 15. The horizontal axis of the diagram represents increasing molar concentration of silicon (Si/(Si+Cr)). The vertical axis represents the temperature of the composition. When the temperature of the adjustable resistor 34 is raised to between 450 and 850° C., separation layer 88 acts as a source layer of silicon for the chromium rich upper layer 102. Silicon atoms from layer 88 migrate to layer 102 and the overall concentration of silicon in the layer 102 increases. Additionally, $SiO_2C$ layer 92 acts as a source of silicon atoms for silicon rich layer 100. When the temperature of the adjustable resistor 34 is raised to between 450 and 850° C. silicon atoms from layer 90 migrate to layer 100 and the overall concentration of silicon in the layer 102 increases. This increase in Si concentration leads to a change in the resistance of the adjustable resistor 34.

The change in resistance is believed to have happened in part because the change in concentration of certain silicon chromium compounds changes. Because the silicon chromium adjustable resistor 34 is deposited by PVD, multiple silicon/chromium compounds (Cr, $Cr_3Si$, $Cr_5Si_3$, CrSi, $CrSi_2$, Si) are present in the thin film in varying concentrations depending on the initial concentrations of silicon and chromium in the PVD process. As heat is applied and more silicon atoms are added to the thin film, fewer chromium-heavy compounds are found and more silicon-heavy compounds are found. This leads to a change in the sheet resistance of the thin film adjustable resistor 34. There may be other or even different mechanisms at work to cause the resistance in the resistor 34 to be permanently altered based on the amount of heat applied to the resistor. Other chemical combinations and modifications may be happening for example new combinations of Cr atoms or other activities which will affect the resistance variations while the inventors continue to investigate these mechanisms and the reasons for the changes, yet the specific examples given for FIGS. 15-18 are examples of combinations that have been found workable.

Figure 20:
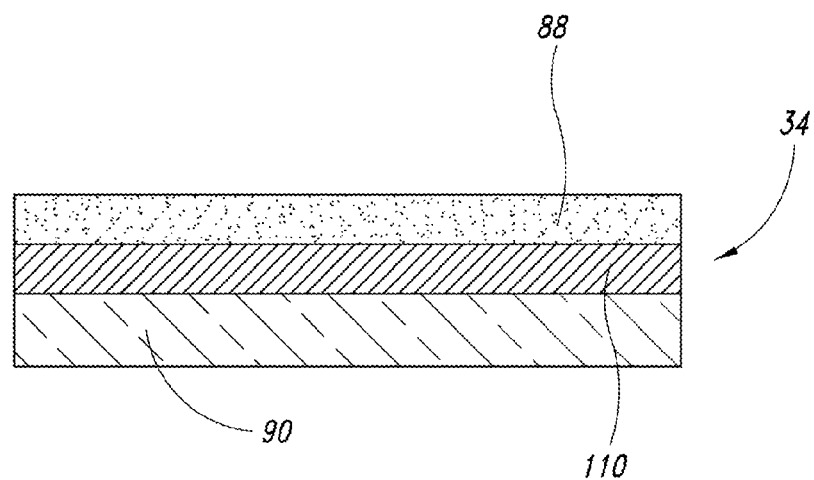
FIG. 20 is a cross section of a thin film adjustable resistor according to one embodiment.

FIG. 20 illustrates a thin film adjustable resistor 34 according to a different embodiment of the invention. In this embodiment the thin film resistor 34 is made from a single layer 110 of chromium silicon. The single film is 5-15 nm thick and is made by PVD of a target material having 45% Si, 20% chromium boride, and 35% silicon carbide by weight. This single layer performs quite differently from the dual layer of FIG. 15.

Figure 21:
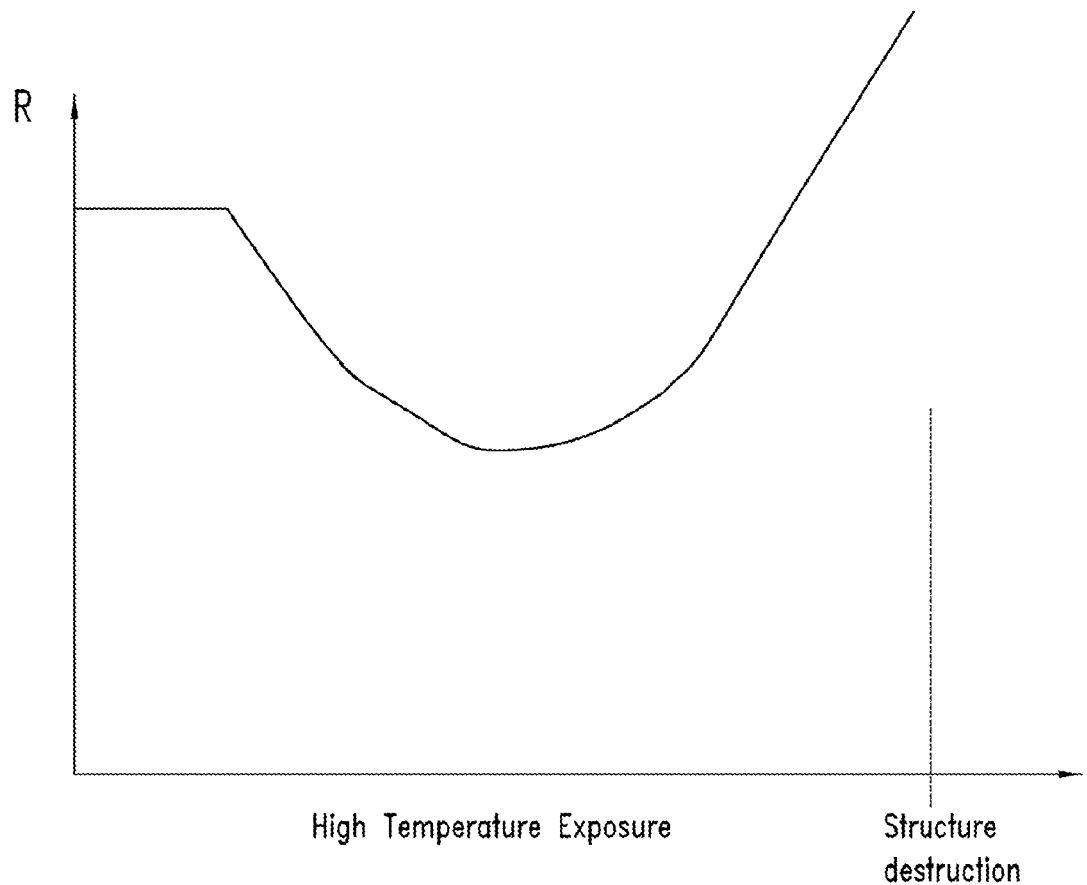
FIG. 21 is a graph of a resistance of an adjustable resistor according to one embodiment.

FIG. 21 shows a curve of the change in resistance of an adjustable resistor 34 based on the single layer of FIG. 20. It can be seen from this curve 125 that the resistance of the adjustable resistor 34 first lowers as the level of heat increases, then begins to rise. Such a thin film resistor 34 can act as a memory cell which can effectively be erased (brought back to the original state). A step of writing to the thin film resistor 34 will decrease the resistance as shown in the downward slope of the curve and thus program the memory cell. A subsequent step of erasure could bring the resistance back near the original value as shown in the later upward slope of the curve. This step of full erasure could only happen one time per memory cell in the case of a 1 bit memory cell. For multi bit memory cells, the erasure could occur in small increments.

Figure 22:
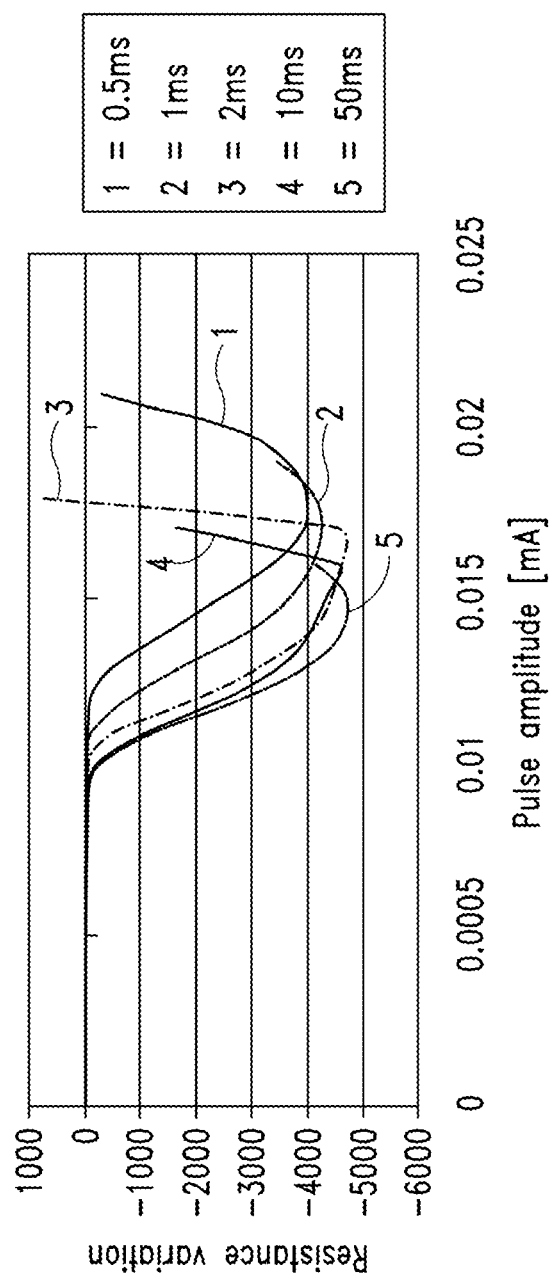
FIG. 22 is a graph of a resistance of an adjustable resistor according to one embodiment.

FIG. 22 shows a series of curves (1-5) of the change in resistance of a thin film resistor 34 of FIG. 20 versus the amplitude of the current in the current pulse used for a write cycle. Each curve 1-5 is plotted for a different pulse length. For example, curve 1 is a curve of the resistance verses amplitude of the current pulse wherein the current pulse lasts for 0.5 ms. In curve 5 the pulse length is 50 ms. Curves 3, 4, 5 each show a maximum resistance drop of about 4.5 kΩ at the bottoms of their respective curves. This represents about a 30% drop in the resistance at the lowest points of their respective curves. The tail end of each curve represents the point at which resistor 34 is destroyed. The general trend is that for lower current values, a longer pulse is required to drop the resistance a same amount.

The embodiments of the thin film adjustable resistor 34 of FIGS. 15 and 18 have both shown examples of chromium silicon adjustable resistors 34. However, many suitable types of thin film can be used to obtain an adjustable thin film resistor 34. In one embodiment, adjustable resistor 34 is a thin film of pure silicon above a silicon oxide dielectric layer. When the silicon thin film is heated, oxygen from the silicon oxide layer is incorporated into the silicon thin film adjustable resistor 34 and the resistance is made greater. Thus, the resistance in some types of layers may increase by being heated rather than decrease. Many other types of thin films could be used to make a memory cell 40 having an adjustable resistor 34.

Figure 24A:
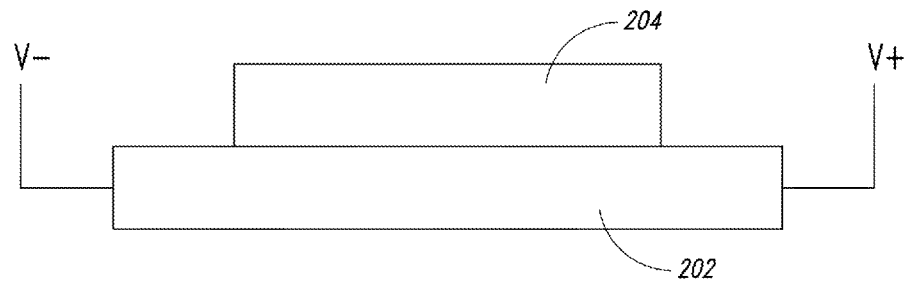
FIG. 24A is a cross section of a thin film adjustable resistor according to one embodiment.
Figure 24B:
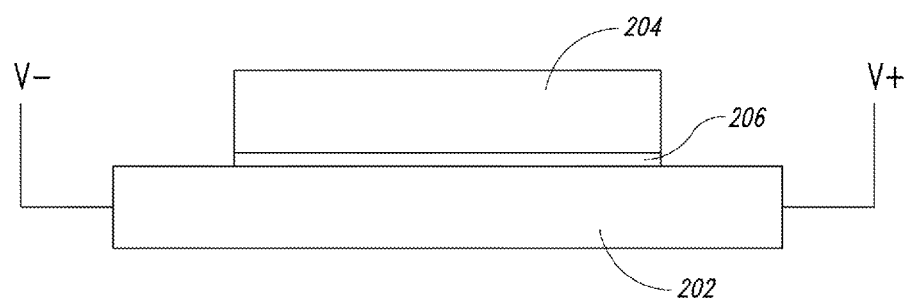
FIG. 24B is a cross section of a thin film adjustable resistor according to one embodiment.

In one embodiment, shown in more detail in FIGS. 24A-24B, adjustable resistor 34 is a thin film resistor 34 formed with a seed layer directly over it or under it, in physical contact with it. The seed layer acts as a source layer of atoms for the thin film adjustable resistor 34. When the heating cycle is applied to the adjustable resistor 34, atoms from the seed layer mix with the main layer and cause a change in resistance. Many combinations of thin films can satisfy this relationship of a seed layer and a main layer and form an adjustable resistor according to one embodiment. Two examples of such a relationship is given in FIGS. 15 and 20, but other embodiments are possible as will now be apparent to those of skill in the art in view of the present disclosure and explained in more detail with respect to FIGS. 24A-24C.

In one embodiment, a memory cell 40 does not contain a heating element 33 that is separate from the adjustable resistor 34. In such an embodiment, data is written to the adjustable resistor 34 by sending a current through the adjustable resistor 34 itself to heat the adjustable resistor 34 to the desired temperature range for the desired duration to alter the resistance of the adjustable resistor 34. However such an embodiment is not preferred because the large current may cause electro migration of atoms in the adjustable resistor 34 and cause degradation of the adjustable resistor 34. Furthermore it is easy for the temperature to go higher than wanted as the resistance will change based on the temperature effects for resistor 34 and may destroy the adjustable resistor 34. It is preferred to use a tantalum aluminum heating element 33 because tantalum aluminum is a refractory metal which is highly durable and able to withstand high temperatures and currents.

Because both the adjustable resistor 34 and heating element 33 are thin films in the dielectric stack, they take up very little space and are conveniently formed and situated. The extra heater lines used with a heating element 33 may be formed at the same time as the metal interconnections, bitlines and wordlines.

The adjustable thin film resistor array 36 allows for increased memory density. Because the adjustable resistor 34 and the heating element 33 are thin films, their resistance varies according to their shape and their sheet resistance. In one embodiment each memory cell 40 comprises only a thin film adjustable resistor 34 (10 squares) and a heating element 33 (5 squares). Thus the size of the memory cell can be made as small as lithography or other machining techniques will allow. In one embodiment a memory cell 40 can be implemented in an area equivalent to about $100 \times Tc^2$ where Tc is the technology node used for processing the memory array 36. For example at the 1 μm technology node, a memory cell takes up 100 μm². At the 32 nm node a memory cell takes up about 0.1 μm². This equates to a density of around 10 Mb/mm² for single bit memory cells. When multiple arrays 36 are stacked, the density increases by a factor of the number of arrays 36. The density further increases for the number of bits each adjustable resistor 34 can store. Very high memory densities can be achieved.

An array 36 of thin film adjustable resistors 34 is not dependent on semiconductor technology. As physical limits begin to prevent further scaling of semiconductor devices, other technologies will be developed. An array 36 of thin film adjustable resistors 34 can be implemented in technology other than semiconductor technology. For example, an array 36 of thin film adjustable resistors 34 may be implemented on a sapphire substrate or any other dielectric stack 56.

Figure 23:
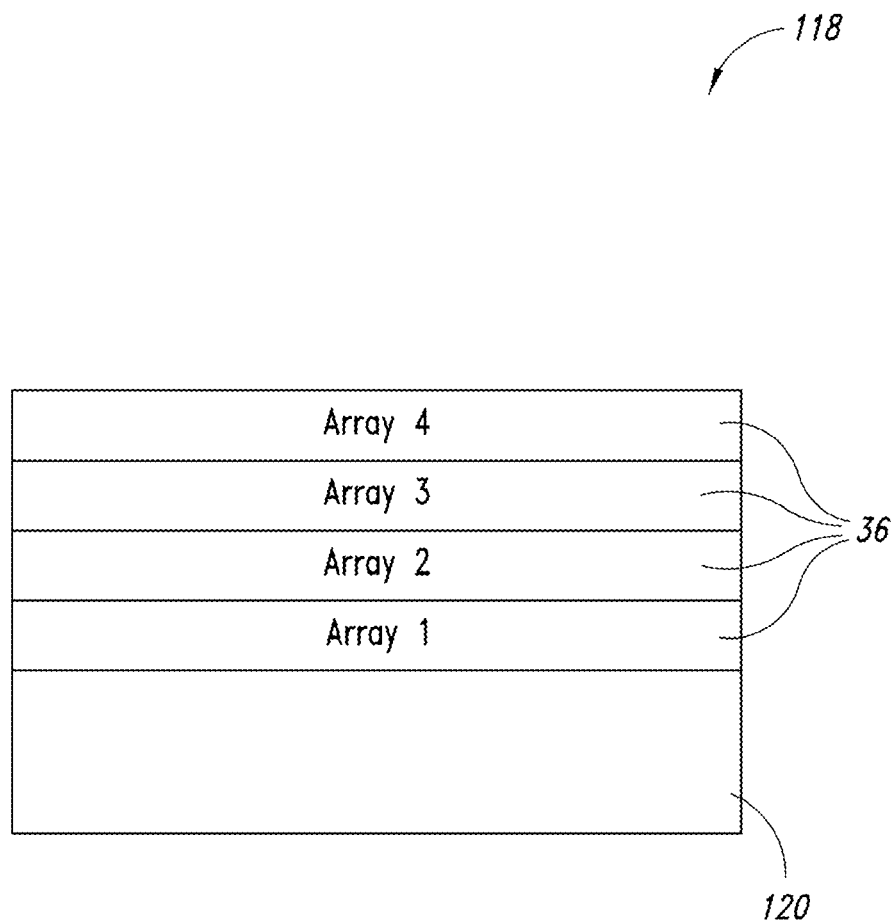
FIG. 23 illustrates a memory device according to one embodiment.

FIG. 23 shows a block diagram of memory device 118 according to one embodiment of the invention. A plurality of memory arrays 36 are formed above substrate 120. The arrays 36 can be implemented in or above a substrate 120 of a standard insulator such as glass, silicon carbide, sapphire, or other suitable insulators. The arrays 36 can be formed above the substrate 120 within dielectric layers in similar fashion to that described in relation to FIGS. 8-10. Each memory array 36 includes a plurality of adjustable resistors 34 and metal interconnect lines. In one embodiment the memory device is packaged and connects to another device by means of a ball grid array, bonding wires, or any other suitable connection means.

The first array of adjustable thin film resistors 34 may be formed on the substrate 120. Metal interconnect lines also may be formed directly on the substrate 120. The second array may be formed on a first dielectric layer above the first array. The third array may be formed on a second dielectric layer above the second array. Metal vias and contacts may extend into the substrate below the first array to connect to a ball grid array, a land grid array, or other suitable electrical connections on the bottom of the substrate for connection to other devices.

As illustrated in FIG. 15 and also 24A-24C, the adjustable resistor 34 can be composed of two layers adjacent each other composed of different materials. The resistor 34 can be custom designed to either increase in resistance or decrease in resistance as it is programmed to stored data. If the layer 100 is composed of silicon, the seed layer 102 positioned adjacent the layer 100 can be selected to either increase the resistance or decrease the resistance. Examples of each of these will now be given.

As one example, as shown in FIG. 15, the layer 100 can be a pure silicon layer in any acceptable form, for example polysilicon, amorphous silicon, or other form. In one embodiment, the silicon layer 100 is deposited as intrinsic pure silicon. Intrinsic silicon, with no dopants, or alternatively, in a preferred embodiment, is formed in the presence of n-type dopants to have a light dopant concentration of N-type dopants, for example $5 \times 10^{12}$ atoms/cm³ as formed in order to provide a uniform and more predictable resistivity when originally formed. The layer 102 is then deposited directly on top of, and in physical contact with, the silicon layer 100. The electrical contacts for the resistor 34 are made to the layer 100 which acts as the electrical resistor in the memory circuit.

The layer 102 is deposited directly on top, and in physical contact with, the layer 100 in one embodiment. In another embodiment, illustrated in FIG. 24B a thin layer of silicon dioxide is formed between the seed layer 102 and the resistive layer 100 as explained elsewhere herein.

The layer 102 contains seed atoms which may be forced to migrate into layer 100 in order to modify its electrical resistance. In one embodiment, the seed layer 102 is an undoped silicon dioxide layer or other oxygen rich layer. When the adjustable resistor 34 is heated, oxygen atoms will migrate from the layer 102 into the layer 100. At a high temperature, the silicon film 100 will accept the oxygen atoms which will interfere with the electrical conductivity of the silicon. The more oxygen atoms which are present in the silicon layer 100, the higher the resistance. With repeated heating cycles, or heating for extended periods of time, a large number of oxygen atoms can be driven into the layer 100, greatly increasing its resistance. In an alternative embodiment, the layer 90, positioned below the layer 100, may also be a donor of oxygen atoms into the layer 100 and oxygen migrating from both sides into the layer 100 can contribute to the change in resistance.

In the event that the seed layer 102 is of the type that will decrease the resistance of layer 100, it may be composed of a layer which is rich in dopant materials known to be dopants with respect to the silicon. For example, layer 102 can be a phosphor-rich layer, one example of which is a phosphor silicate glass layer, PSG, having a high concentration of phosphorous atoms, for example 20% or higher. When the resistor 34 is heated, phosphorous atoms from layer 102 will migrate into the silicon 100 reducing its resistivity. With repeated heating cycles, additional phosphorous atoms will be driven into the silicon 100, further reducing its resistivity. In a further alternative, the layer 102 is enriched with arsenic atoms instead of phosphorous atoms. As is known, arsenic atoms are considerably larger phosphorous atoms and do not migrate as easily from one layer to another. Accordingly, using arsenic-enriched material for layer 102 would be more likely to ensure that the dopants only migrate when heated and not during normal operation.

Alternatively, the layer 102 may be a layer which is heavy with boron, such as a BSG layer if P-type dopants are desired instead of N-type dopants. In the event P-type dopant atoms are desired instead of N-type dopant atoms, the layer 102 can be enriched with boron, such as a BSG layer. As with phosphorous and arsenic, when the resistive structure 34 is heated boron atoms will migrate from the boron-rich layer 102 to the silicon layer 100, thus reducing its resistivity.

The use of silicon for the resistive layer 100 has the advantage that the resistivity can be varied over a much wider range than is with possible with a silicon chromium material. The silicon chromium has the benefit that it is highly stable during normal operating conditions and its resistivity can be assured of remaining a constant for long periods of time, several decades even when subjected to a wide range of temperatures from $-40°$ C. to $300°$ C. One advantage of a SiCr adjustable resistor 34 is that it is highly stable over a wide temperature range, but programming can only occur when the resistor is heated to a very high temperature, generally in the range of $500°$ C. or higher. Use of silicon or germanium or other materials together with a donor layer adjacent thereto has the advantage that it can be programmed at a lower temperature range, for example in the range of $200°$ C.

Figure 24C:
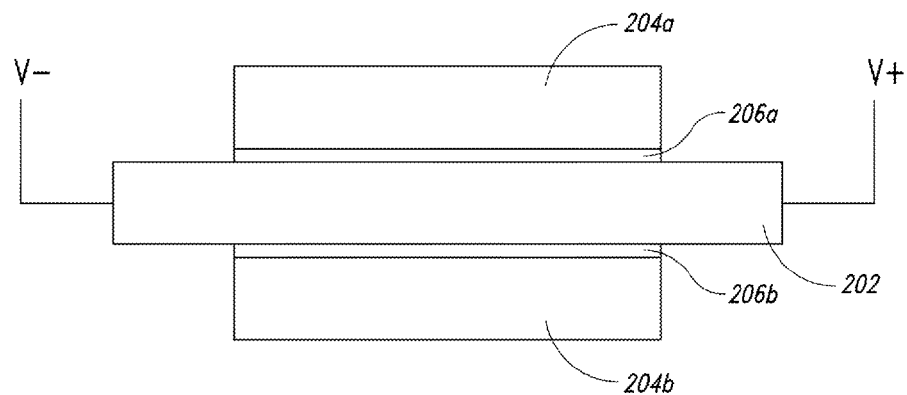
FIG. 24C is a cross section of a thin film adjustable resistor according to one embodiment.

FIGS. 24A-24C illustrate further embodiments. As shown in FIG. 24A, a resistor layer 202 is electrically coupled to the terminals to provide a data storage node. A seed layer 204 is on top of the resistor layer 202. A large number of different materials may be used for the resistive film 202. In some instances, the film 202 may be a semiconductor. The semiconductor may be selected from any acceptable group including Si, Ge, AlSb, GaAs, GaP, GaSb, InAs, InP, InSb, or any other number of well known semiconductors. The seed layer will be appropriately selected based on the desired properties for programming the resistor. For example, if the resistor is GaAs, then the seed layer may be infused with the appropriate dopant, whether N- or P-type, for GaAs, for example Sn, Ge, or Si, or in some cases Be. On the other hand, if an indium-based semiconductor, for example InAs, InP, InSb, then the appropriate N- or P-type dopants will be placed in the seed layer. The type of material selected for the resistive layer 202 and the seed layer will be based on the desired stability of the resistor as well as the ease of programming. For some materials, such as silicon as the resistive layer and a phosphorous seed layer, relatively low programming temperatures may be obtained. However, some additional steps may be needed as explained herein in order to prevent the resistivity of the layer 202 from changing when it has not been programmed. In some applications, a highly stable layer, such as a chromium-based silicon is preferred. The chromium-enriched silicon layers as resistors have been demonstrated to be highly stable and have a constant resistance over a wide range of operating temperatures. Programming requires elevated temperatures, which in some environments is a significant advantage, while in other applications may be undesired.

The resistor layer 202 may alternatively be a non-semiconductor based material. For example, the resistor layer may be a carbon based material such as graphite or graphene. In this case the seed layer 204 may be infused with appropriate dopants such as B, N or other dopants to alter the resistance of a carbon based material. Carbon based materials have an added advantage that it is possible to alter the resistance at much lower temperatures, for example temperatures less than $400°$ C. The heater current in such a write cycle is on the order of 10 μA. Furthermore, the resistance of a carbon based resistor layer 202 can be altered very quickly. It is possible to perform a write cycle in less than 1 μs. The reduced temperature of the write cycle coupled with the reduced duration of the write cycle allows for a significant reduction of power in performing a write cycle.

FIG. 24B illustrates a further alternative embodiment. In FIG. 24B, the layer 202 is composed of pure silicon having little or no dopant as initially formed as an unprogrammed resistor. The pure silicon layer is deposited for example by PVD. A layer 206 of undoped silicon dioxide, silicon nitride, or other barrier layer is deposited on the silicon layer 202 after which a dopant-rich layer 204 is deposited on the silicon dioxide layer. The dopant-rich layer 204 can be any acceptable material for holding a high concentration of donor atoms. For example, it can be another silicon layer heavily doped with N-type donor atoms such as phosphorous or arsenic, or P-type donor atoms such as boron. Alternatively, it can be heavily doped silicate glass, either a PSG, ASG, or BSG. The layer 206 is a relatively thin layer, in the range of 7-20 Å. The layer 206 is made of a material which under normal operating conditions will block the easy migration of donor atoms from the layer 204 into the layer 202. In one embodiment, the layer 206 is a silicon dioxide layer while in another embodiment it is a silicon nitride layer. Using a heavily doped donor layer such as a PSG layer having a high concentration of phosphorous has the advantage of permitting low temperature for programming of the resistive layer 202 due to the easy migration of phosphorous atoms from the seed layer 204 into the resistive layer 202. In some embodiments, in the seed layer 204 is in physical contact with the resistive layer 202, the phosphorous atoms may migrate at too low of a temperature causing a change in the resistivity of the layer 202 which has not been programmed. Accordingly, placing the layer 206 in between the dopant-enriched seed layer 204 and the resistive layer 202 will prevent the unwanted migration of the donor atoms. All migration at temperatures below the programming temperature, for example below $150°$ C., will be prevented by the presence of the thin-barrier layer 206. If the resistor is heated up to a programming temperature, for example $250°$ C., then the donor atoms will easily migrate through the thin barrier 206 and into the resistive layer 202, thus permitting it to be programmed. The barrier layer 206 is preferably made extremely thin so as to permit easy passage of the donor atoms from the seed layer 204 into the resistive layer 202 once an elevated temperature is reached. However, it is sufficiently thick and of a material to prevent any unwanted migration when programming is not taking place.

FIG. 24C illustrates yet a further embodiment according to principles of the present invention. In this embodiment, the seed layer 204 is on both sides of the resistive layer 202. The seed layer may be directly adjacent the resistive layer 202 as shown in FIG. 24A or have thin barrier layer 206a, 206b positioned between it and the resistive layer 202 depending on the materials used.

Depending on the type of atoms which will migrate from the seed layer 204 to the resistive layer 202, the barrier 206 may or may not be needed. For example, oxygen atoms will only move at high temperatures and therefore such a barrier layer is not needed. On the other hand, some types of atoms, such as phosphorous, migrate slowly over time and therefore a thin barrier layer will be appropriate.

One specific advantage of the present invention is that it can be manufactured on any acceptable substrate in very high densities. As mentioned, the memory can be constructed using standard semiconductor processing techniques on a sapphire substrate. Other substrates, such as quartz, high-density glass, or other materials may also be used. For arrays manufactured on nonconducting substrates such as sapphire and quartz, electrical leads to external connections can be formed using metal deposition and etch techniques as is well known in the art. The leads can provide access to the memory array so the data can be stored in the memory at a programming station and then the memory can be moved and transported to a number of locations without being coupled to an external power source. The memory can then be plugged into an acceptable port and the data read out. Such a memory has the distinct advantage of providing long-term storage of the data with no need for an optical device or a motor to read the memory. Simple electrical circuits may be used to read the memory which may be easily constructed at a low cost. The memory, in some instances, can be a fairly simple memory with only dozens of bits of data, or a much more complex memory having many gigabits. Since the array itself does not have any semiconductor material, in some embodiments it will be less susceptible to destruction and loss of data than those memories which include semiconductor substrates or which rely on the movement of electrons in order to store data. For example, EEPROM, FLASH, and the like are programmed by forcing the movement of electrons from one location to another and a charge is held stored on a floating gate to represent the value of the data. Since the charge is stored as electrons held in a certain area, such memories are susceptible to loss of data if there is unexpected leakage of the stored data values as may occur if the circuit is subjected to temperatures above a normal operating range or when a radiation particle strikes the memory.

One particular application with the present memory which has a distinct advantage is in radiation-hardened memories. Semiconductor memories frequently experience loss of data if exposed to radiation, which may include alpha particles, beta particles, or gamma particles. In the event of a large explosion, particularly a nuclear explosion, a large amount of radiation is emitted which will destroy exposed active silicon devices. A memory made according to the principles of the present invention is a radiation-hardened memory and will not be susceptible to changing the data value, even if subjected to high amounts of radiation.

In addition, the present memory is useful in extreme thermal conditions well outside standard industrial temperatures. The data stored in the memory will not be lost due to a wide range of temperature variations. Current FLASH memories are very susceptible to loss of data if subjected to wide temperature swings. For example, the present memory remains fully operational and can properly store the data even if subjected to temperature ranges from minus 200° C. to in excess of 350° C. Using the principles of the present invention as explained herein, a material can be selected for the resistor 202 which is highly stable in storing the data value, even if subjected to harsh conditions such as exposure to wide temperature swings, radiation, salt water, or other environmental factors which normally destroy electrical circuits.

A further advantage of the present invention is that the data can be highly secure and is not susceptible to reverse engineering as is done in the standard ROM. As is known, standard ROM codes can be reverse engineered by visually inspecting the ROM to determine the value of the data stored, whether a "1" or a "0." In the present invention, the resistor has the same visual and mechanical properties regardless of the value of the data stored and therefore cannot be easily reverse engineered. The appropriate electronic security codes can be used to prevent tampering with or obtaining the data except with the proper authorization.

Figure 25:
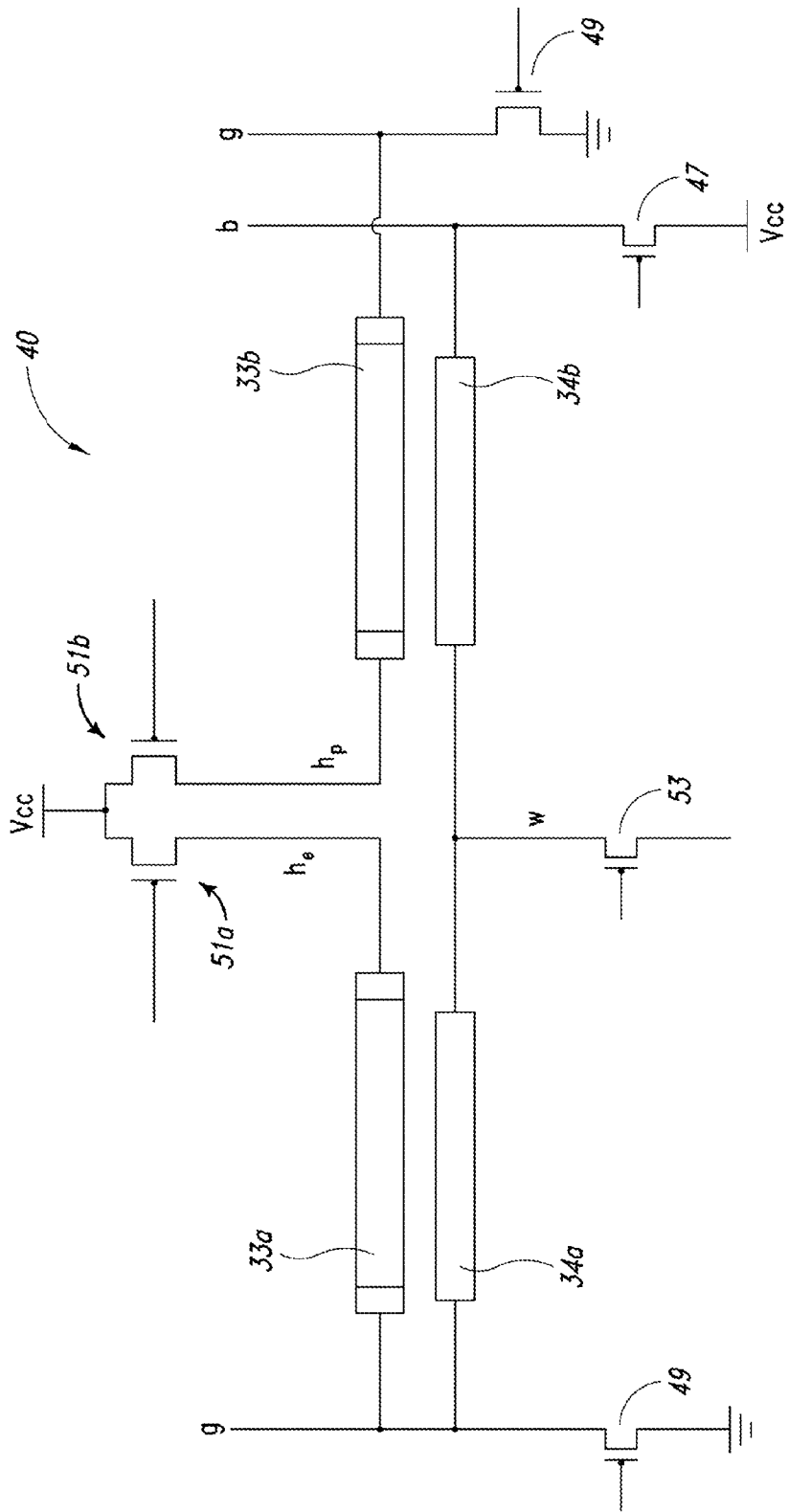
FIG. 25 is a schematic of a memory cell including two thin film adjustable resistors according to one embodiment.

FIG. 25 illustrates a memory cell 40 according to one embodiment. The memory cell 40 includes a first thin film heating element 33a and a second thin film heating element 33b. The memory cell 40 also includes a first thin film adjustable resistor 34a and a second thin film adjustable resistor 34b. The resistance of the first thin film adjustable resistor 34a can be altered by the first thin film heating element 33a, as described previously. The resistance of the second thin film adjustable resistor 34b can be adjusted by the second thin film heating element 33b. The first thin film heating element 33a is coupled between an erasing heating line $h_e$ and a ground line g. The second thin film adjustable resistor 33b is coupled between a programming heating line $h_p$ and a ground line g. The first thin film adjustable resistor 34a is coupled between the second thin film adjustable resistor 34b and the ground line g. The second thin film adjustable resistor 34b is coupled between the first thin film adjustable resistor 34a and bitline b. The erasing heating line $h_e$ is coupled to voltage source Vcc by the transistor 51a. The transistor 51a can connect or disconnect the heating line $h_e$ from voltage Vcc. The programming heating line $h_p$ is coupled to the voltage source Vcc by the transistor 51b. The transistor 51b can connect or disconnect the heating line $h_p$ from voltage Vcc. The ground line g is coupled to ground through a switch 49. The transistor 49 can connect or disconnect the ground line g from ground voltage. A word line w is connected between the first thin film adjustable resistor 34a and the second thin film adjustable resistor 34b. A switch 53 couples the word line W to a reading circuit not shown in FIG. 25.

The first thin film adjustable resistor 34a is an erasing adjustable resistor. The second thin film adjustable resistor 34b is a programming adjustable resistor. When data is to be written to the memory cell 40, the programming heating line $h_p$ is brought to voltage Vcc by turning on transistor 51b. A current then flows through the second thin film heating element 33b and heats the programming adjustable resistor 34b causing the resistance of the programming adjustable resistor 34b to be altered as described previously.

Prior to programming the memory cell 40, the resistance of the programming adjustable resistor 34b and the erasing adjustable resistor 34a are the same. Data is written to the memory cell 40 by altering the resistance of the programming adjustable resistor 34b so that it is different from the resistance of the erasing adjustable resistor 34a.

Data can be subsequently erased from the memory cell 40 by connecting the erasing heating line $h_e$ to voltage Vcc by turning on the transistor 51a. This causes a current to flow to the thin film heating element 33a which heats up the erasing adjustable resistor 34a and alters the resistance of the erasing adjustable resistor 34a. The resistance of the erasing adjustable resistor 34a is made to be substantially the same as the resistance of the programming adjustable resistor 34b. In this way, data can be erased from the memory cell 40. Data can subsequently be written to the memory cell 40 by again adjusting the resistance of the adjustable resistor 34b so that it is different from the resistance of the adjustable resistor 34a. In other words, data is written to the memory cell by causing a difference in the resistances of the two adjustable resistors 34a and 34b. Data is erased from the memory cell by causing the resistances of the adjustable resistors 34a and 34b to be the same. The adjustable resistors 34a and 34b can be formed according to the materials and processes described previously. In one example the heating elements 33a, 33b are TaAl heating elements, and the adjustable resistors 34a, 34b are chromium silicon adjustable resistors as described previously.

In one embodiment, programming the memory cell 40 includes reducing the resistance of the adjustable resistor 34b. Erasing data from the memory cell can be performed by subsequently reducing the resistance of the adjustable resistor 34a. Multiple programming and erasing cycles can be performed on the memory cell 40. The number of programming and erasing cycles possible in the lifetime of the memory cell 40 is based in part on the size of the increments by which the resistance of the adjustable resistors 34a and 34b can be reliably adjusted. In one embodiment, 50 or more programming and erasing cycles can be performed. The resistances of the adjustable resistors 34a and 34b can be altered in increments of 1% or smaller. The number of programming and erasing cycles is also based in part on the sensitivity of the reading circuits. The more sensitive the circuitry which reads data from the memory cell 40, the smaller the increments of adjustment can be and the more programming and erasing cycles can be performed.

The resistances of the adjustable resistors 34a, 34b have been described as being the same in the unprogrammed or erased data state. However, in practice the resistances in the unprogrammed or erased state may be slightly different so long as the difference falls within an error tolerance, in part determined by the design of the data reading circuit. Thus, in one embodiment the resistances of the adjustable resistors 34a, 34b in the unprogrammed or erased state are substantially the same.

Figure 26:
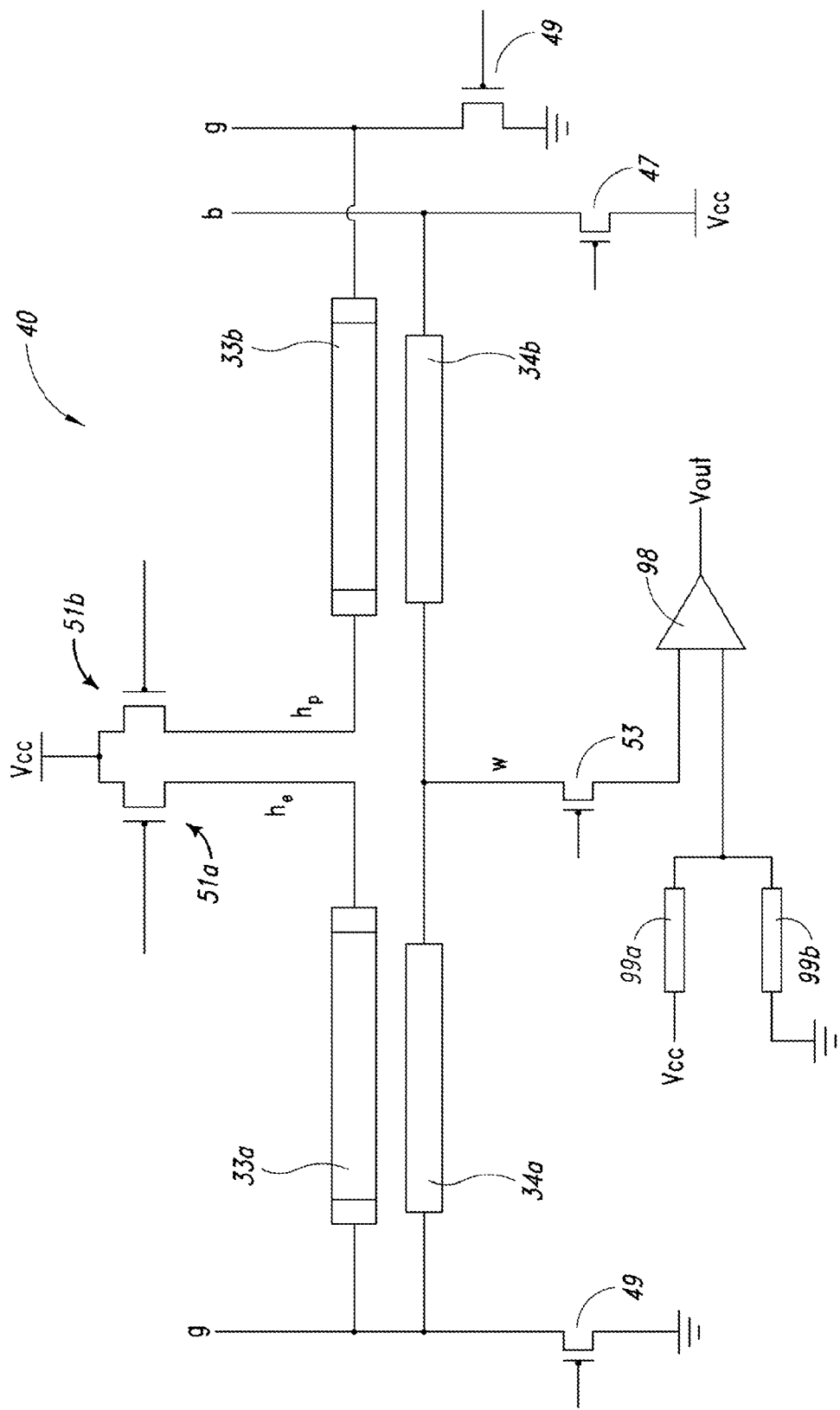
FIG. 26 is a schematic of the memory cell of FIG. 25 including a data reading circuit.

FIG. 26 illustrates the memory cell 40 of FIG. 25 including a memory reading circuit 97 according to one embodiment. The adjustable resistors 34a and 34b are connected to a word line w which is in turn connected to a comparison circuit 98 by a switch 53. Two identical reference resistors 99a and 99b are connected in series between voltage Vcc and ground voltage. One input of the comparison circuit 98 is connected to a common node connecting the reference resistors 99a and 99b.

When data is to be read from the memory cell 40, the bitline b is brought to voltage Vcc by turning on transistor 53. The ground line g is brought ground voltage by turning on transistor 49. The word line w is connected to the comparison circuit 98 by turning on the switch 53. A current will flow between the bitline b and the ground line g through the adjustable resistors 34b and 34a. The adjustable resistors 34b and 34a form a voltage divider causing an intermediate voltage to appear on the word line w. The voltage on the word line w will be some fraction of the voltage Vcc according to the difference in the resistances of the adjustable resistors 34a and 34b. If the resistance of the adjustable resistors 34a and 34b is the same, then the voltage at the word line w will be one half of Vcc. If the resistance of the adjustable resistor 34b is lower than the resistance of the adjustable resistor 34a, then the voltage on the word line w will be greater than one half of Vcc.

The resistances of reference resistors 99a and 99b are equal to each other and therefore the voltage that they output to the comparison circuit 98 is one half of Vcc. If the voltage on the word line w is higher than one-half Vcc then the comparison circuit 98 will output a high voltage at Vout. This high voltage at Vout indicates that data has been written to the memory cell 40. If the voltage on the word line w is one half Vcc or higher, then the comparison circuit 98 will output a low voltage at Vout. The low voltage at Vout indicates that the memory cell 40 is unprogrammed or that data has been erased from the memory cell 40.

While FIG. 26 illustrates a data reading circuit 97 including a comparator 98 and reference resistors 99a and 99b, other types of reading circuits are possible. Any appropriate reading circuit 97 can be used to read data from the memory cell 40. All such data reading circuits fall within the scope of the present disclosure.

Figure 27:
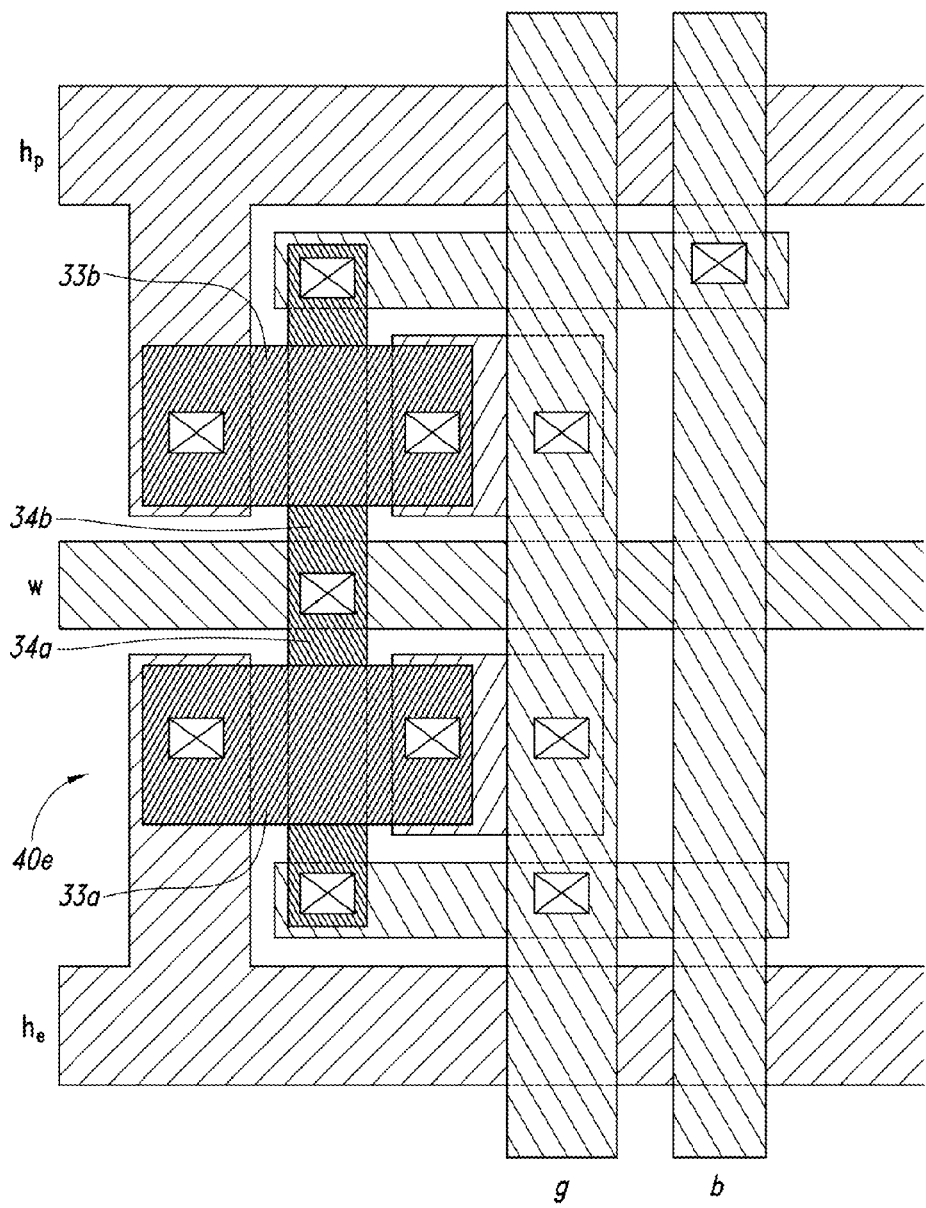
FIG. 27 is top view of a layout of a memory cell including two thin film adjustable resistors according to one embodiment.

FIG. 27 illustrates a top view layout of a memory cell 40 according to one embodiment. The memory cell 40 includes heating elements 33a and 33b as well as adjustable resistors 34a and 34b. The memory cell 40 further includes heating lines $h_p$ and $h_e$, word line w, bitline b and ground line g. Heating lines $h_p$ and $h_e$, as well as word line w, are formed in metal layer $M_n$. Bitline b and ground line GND are formed in a higher metal layer, level $M_{n+1}$. Adjustable resistor 34a is connected to word line w and ground line g. Heating element 33a is connected between heating line $h_e$ and ground line g. Heating element 33a overlies adjustable resistor 34a. Adjustable resistor 34b is connected between word line w and bitline b. Heating element 33b is connected between heating line $h_p$ and ground line g. Heating element 33b overlies adjustable resistor 34b.

When data is to be written to the memory cell 40, heating line $h_p$ is connected to voltage Vcc and ground line g is connected to voltage ground. This causes a current to flow through heating element 33b and to heat up adjustable resistor 34b and to change the resistance of the adjustable resistor 34b as described previously. The resistance of the adjustable resistor 34b is now different than the resistance of the adjustable resistor 34a. To erase data from the memory cell 40, the heating line $h_e$ is brought to voltage Vcc and the ground line g is brought to voltage ground. This causes a current to flow through heating element 33a and to heat up adjustable resistor 34a and to alter the resistance of the adjustable resistor 34a. The resistance of the adjustable resistor 34a is altered in an increment substantially identical to the increment by which the adjustable resistor 34b was altered when writing data to the memory cell 40. Therefore, a programming cycle creates a difference between the resistances of the adjustable resistors 34a and 34b, and an erasing cycle causes the resistances of the adjustable resistors 34a and 34b to be substantially the same.

When data is to be read from the memory cell 40, bitline b is brought to voltage Vcc and ground line g is brought to ground voltage Vss. Word line w is connected to the data reading circuit 97. A current thus flows through the adjustable resistors 34b and 34a from bitline b to ground line g. This causes a voltage to appear on word line w which is a fraction of the voltage between bitline b and ground line g. The data reading circuit then compares this voltage to a reference voltage and the result of this comparison indicates whether data has been written to the memory cell 40 or not. The layout illustrated in FIG. 27 is given by way of example. Many other layouts are possible, as will be apparent to those of skilled in the art in light of the present disclosure. All such possible layouts of the memory cell 40 fall within the scope of the present disclosure.

Figure 28:
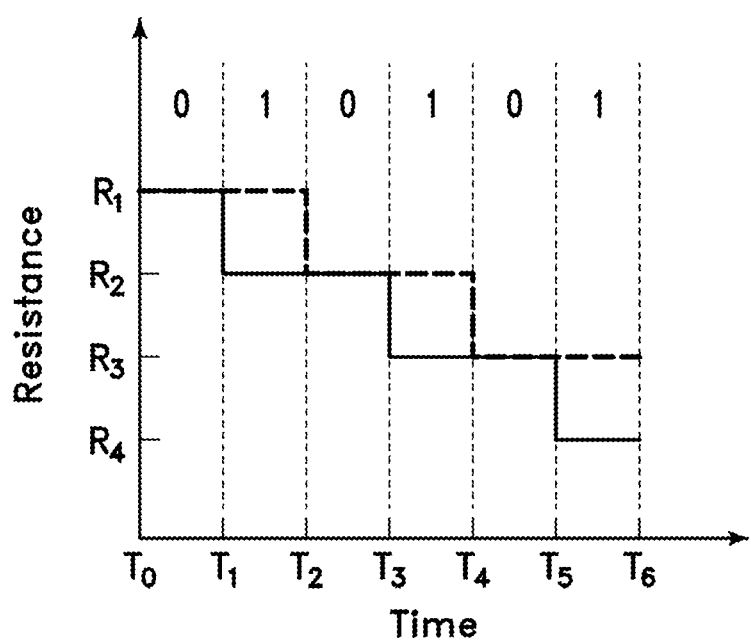
FIG. 28 is a graph of the resistances of two adjustable resistors of a memory cell according to one embodiment.

FIG. 28 illustrates a graph of the resistances of adjustable resistors 34a and 34b of FIG. 25 according to one embodiment. At time $T_0$ the resistance of the adjustable resistor 34a represented by dashed lines is substantially equal to the resistance of the adjustable resistor 34b represented by a solid line. The data state of the memory cell 40 between time $T_0$ and time $T_1$ is 0 because the resistances of the adjustable resistors 34a and 34b are substantially the same.

At time $T_1$ the resistance of the adjustable resistor 34b has been altered. The resistance of the adjustable resistor 34b decreases to resistance $R_2$. The resistance of the adjustable resistor 34a has not been altered, and remains at resistance $R_1$ between times $T_1$ and $T_2$. Because the resistances of the adjustable resistors 34a and 34b are different during the period between times $T_1$ and $T_2$, data value 1 is stored in the memory cell 40 between times $T_1$ and $T_2$.

At time $T_2$ the resistance of the adjustable resistor 34a is altered so that it decreases to resistance $R_2$ and is substantially the same as the resistance of the adjustable resistor 34b. Because the resistance of the adjustable resistors 34a and 34b is substantially the same between time periods $T_2$ and $T_3$, the data state of the memory cell 40 is 0 in this time range.

At time $T_3$ the resistance of the adjustable resistor 34b is reduced to resistance $R_3$. The resistance of the adjustable resistor 34a during the period between times $T_3$ and $T_4$ remains at resistance $R_2$ different from resistance $R_3$. Because the resistances of the adjustable resistors 34a and 34b are different in this time period, the data value of memory cell 40 is 1.

At time $T_4$ the data state is again erased to be 0 by bringing the resistance of the adjustable resistor 34a to resistance $R_3$, the same resistance as the resistance of the adjustable resistor 34b. At time $T_5$ data is again written to the memory cell 40 by reducing the resistance of the adjustable resistor 34b to resistance $R_4$.

The spacings of times $T_0$, $T_1$, $T_2$, $T_3$, $T_4$, and $T_5$ appear to be equal in the graph in FIG. 28. However, these time lengths can be any arbitrary time lengths. They simply illustrate how data can be written and erased from time to time. Data can be written to a memory cell 40 at one time and the state of the memory cell 40 will remain until another time when the data is erased from the memory cell 40. Such time lengths may be as long or as short as desired. In fact, data may be written to a memory cell 40 and the memory cell 40 may never be erased in one implementation due to the particular purpose and use of the data stored in the memory array 36 as a whole. In other uses, the data in the memory cell 40 can be repeatedly programmed and erased many more times than shown in FIG. 28. Thus the times shown in FIG. 28 are arbitrary time periods used only to illustrate that some time has elapsed between programming and erasing cycles of the memory cell 40.

Figure 29:
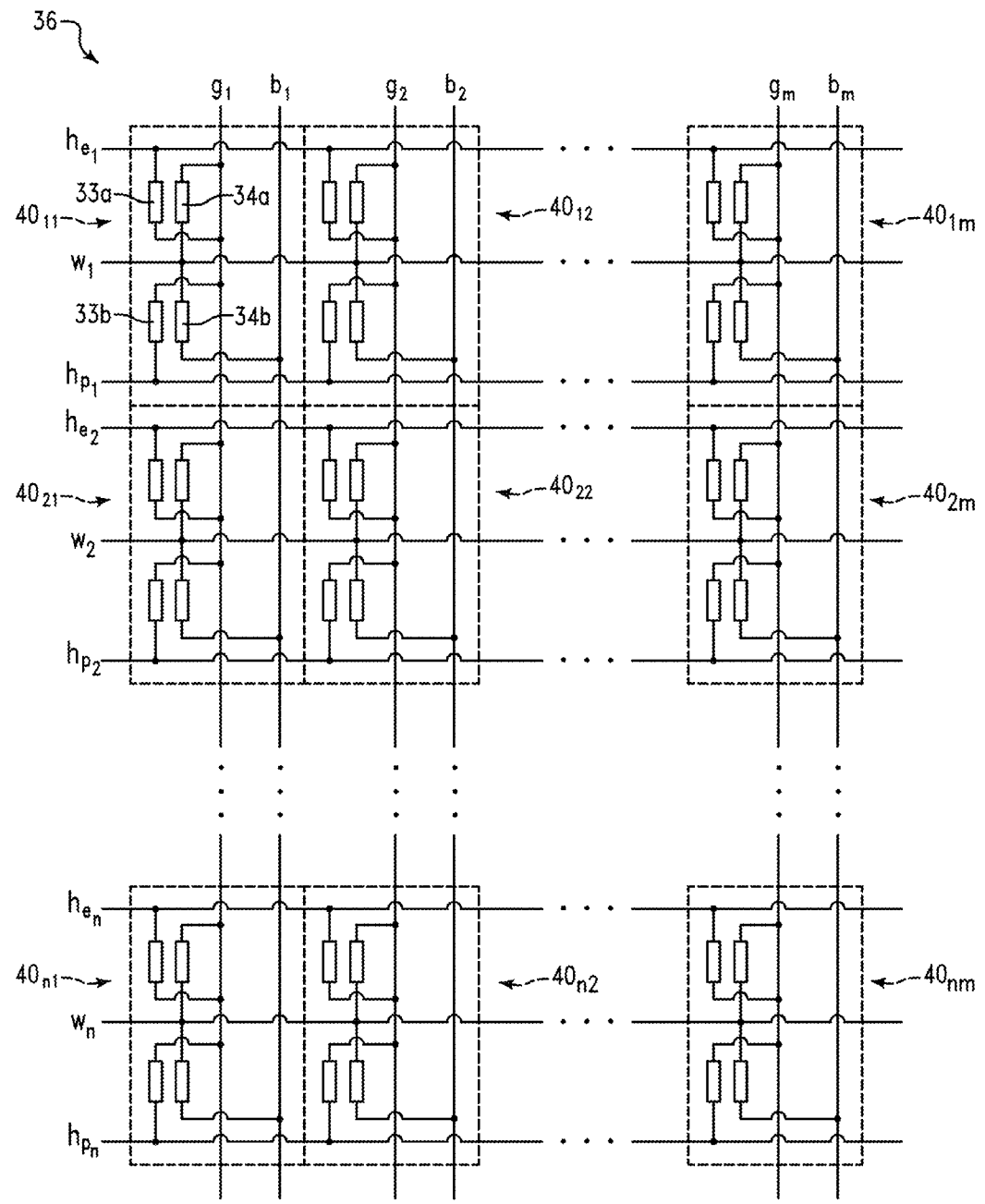
FIG. 29 is a schematic of a memory array according to one embodiment.

FIG. 29 illustrates an array 36 of memory cells 40 according to one embodiment. Each memory cell 40 of the array 36 is a memory cell 40 according to FIGS. 25-28. The memory cells 40 of the memory array 36 are substantially identical to each other. Each memory cell 40 includes respective adjustable resistors 34a and 34b as well as respective heating elements 33a and 33b. The memory array 36 is broken into rows and columns of memory cells 40. Memory cell $40_{11}$ is in a first row and a first column of memory cells. Heating element 33a of memory cell $40_{11}$ is connected between heater line $h_{e1}$ and ground line $g_1$. Adjustable resistor 34a is connected between ground line $g_1$ and word line $w_1$. Heating element 33b is connected between heating line $h_{p1}$ and ground line $g_1$. Adjustable resistor 34b is connected between bitline $b_1$ and word line $g_1$. The programming, erasing, and reading of the memory cells in the array 36 are done as described in relation to FIGS. 25-28.

Memory cell $40_{1M}$ is in row 1 and column M of the memory array 36. Memory cell $40_{1M}$ is connected to heater lines $h_{e1}$ and $h_{p1}$ and to word line $w_1$. The memory cell $40_{1M}$ is further connected to ground line $g_M$ and bitline $b_M$.

Memory cell $40_{N1}$ is located in row N and column 1 of the array 36. The memory cell $40_{N1}$ is connected to heater lines $h_{eN}$ and $h_{pN}$ as well as word line $w_N$. The memory cell $40_{N1}$ is also connected to ground line $g_1$ and bitline $b_1$. Memory cell $40_{NM}$ is located in row N and column M of the array 36. The memory cell $40_{NM}$ is connected to heater lines $h_{eN}$ and $h_{pN}$ as well as word line $w_N$. The memory cell $40_{NM}$ is further connected to ground line $g_M$ and bitline $b_M$. The heater lines of the array 36 can be connected or disconnected to voltage Vcc. The word lines of the array 36 can be selectively connected to data reading circuits 97. The bitlines $b_1$-$b_M$ of the array 36 can be selectively connected to voltage Vcc. The ground lines $g_1$-$g_M$ of the array 36 can be selectively connected to ground voltage. Data can be programmed, erased, or read from any of the individual memory cells 40 of the array 36 by selecting the appropriate heater line, word line, ground line, or bitline.

Many other configurations are possible for the memory array 36 according to one embodiment. Furthermore, different voltages can be used between the heater lines, the bitlines, the ground lines, and the word lines. For example, the heater lines may be subjected to a high programming voltage higher than Vcc. Many configurations and voltages are possible as will be apparent to those of skill in the art in light of the present disclosure.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An Integrated circuit die comprising:
   a memory cell including:
      a first thin film adjustable resistor;
      a second thin film adjustable resistor; and
   a data writing circuit coupled to the memory cell and configured to write data to the memory cell by altering the resistance of the first thin film adjustable resistor and to erase data from the memory cell by altering the resistance of the second thin film adjustable resistor.

2. The integrated circuit die of claim 1 wherein the memory cell further includes:
   a first thin film heating element coupled to the data writing circuit and configured to alter the resistance of the first thin film adjustable resistor by heating the first thin film adjustable resistor; and
   a first thin film heating element coupled to the data writing circuit and configured to alter the resistance of the second thin film adjustable resistor by heating the second thin film adjustable resistor.

3. The integrated circuit die of claim 2 wherein the memory cell further includes a dielectric layer a dielectric layer separating the first thin film heating element from the first thin film adjustable resistor and separating the second thin film heating element from the second thin film adjustable resistor.

4. The integrated circuit die of claim 1 wherein the data writing circuit is configured to write data to the memory cell by increasing a difference between the resistances of the first and second thin film adjustable resistors and to erase data from the memory cell by decreasing a difference between the resistances of the first and second thin film adjustable resistors.

5. The integrated circuit die of claim 4 wherein the data writing circuit is configured to erase data from the memory cell by altering the resistance of the second thin film adjustable resistor to be substantially equal to the resistance of the first thin film adjustable resistor.

6. The integrated circuit die of claim 1 wherein the data writing circuit is configured to erase data from the memory cell by increasing a difference between the resistances of the first and second thin film adjustable resistors and to write data from the memory cell by decreasing a difference between the resistances of the first and second thin film adjustable resistors.

* * * * *